United States Patent
Higuchi

(10) Patent No.: US 6,815,366 B2
(45) Date of Patent: Nov. 9, 2004

(54) METHOD FOR ETCHING ORGANIC INSULATING FILM AND METHOD FOR FABRICATING SEMICONDUCTOR DEVICE

(75) Inventor: Kenichi Higuchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/654,979

(22) Filed: Sep. 5, 2003

(65) Prior Publication Data

US 2004/0058552 A1 Mar. 25, 2004

(30) Foreign Application Priority Data

Sep. 20, 2002 (JP) ........................................ 2002-274617

(51) Int. Cl.$^7$ ............................................. H01L 21/302
(52) U.S. Cl. ...................... 438/714; 438/717; 438/725; 438/734; 216/67; 216/71
(58) Field of Search ................................ 438/714, 717, 438/725, 734; 216/67, 71

(56) References Cited

U.S. PATENT DOCUMENTS 5,688,330 A * 11/1997 Ohmi ...................... 118/723 E
6,326,302 B1 * 12/2001 Joubert et al. .............. 438/638
6,475,918 B1 * 11/2002 Izawa et al. ................ 438/714

FOREIGN PATENT DOCUMENTS

| JP | 53-045375 | * 4/1978 |
| JP | 2001-110784 | 4/2001 |

* cited by examiner

Primary Examiner—George A. Goudreau

(74) Attorney, Agent, or Firm—Westerman, Hattori, Daniels & Adrian, LLP

(57) ABSTRACT

In the method for etching the organic insulating film in which the first RF power is applied to the electrode 12 with the object-to-be-processed having the organic insulating film mounted on and the second RF power is applied to the electrode 14 opposed to the electrode 12, whereby plasma of gas containing $NH_3$ is generated to etch the organic insulating film, the first RF power and the second RF power are controlled so as to make the Vpp value of the voltage applied to the electrode 12 below 500 V. Thus, the organic insulating film can be vertically processed while the bow amplitude and the corner loss amount of the hard mask are decreased.

18 Claims, 20 Drawing Sheets

SiO
SiLK
SiO

SiO
SiLK
SiO

SiO
SiLK
SiO

METHOD FOR ETCHING ORGANIC INSULATING FILM AND METHOD FOR FABRICATING SEMICONDUCTOR DEVICE

CROSS-REFERENCE TO RELATED APPLICATIONS

This application is based upon and claims the benefit of priority from the prior Japanese Patent Application No. 2002-274617, filed in Sep. 20, 2002, the entire contents of which are incorporated herein by reference.

BACKGROUND OF THE INVENTION

The present invention relates to a method for etching organic insulating films and a method for fabricating semiconductor devices, more specifically to a method for etching organic insulating films which can form vertically etching profiles having little bowing and can have little corner loss of the hard mask, and a method for fabricating the semiconductor device using the etching method.

As semiconductor devices are larger scaled and more integrated, design rules for the interconnections are more diminished with generations. Conventionally, the metal interconnection layer has been formed by depositing the interconnection material and patterning the deposited interconnection material by lithography and dry etching. However, as generations advance, the technical limits have been found. As a new process which takes over the conventional interconnection forming process, the so-called damascene process in which after groove patterns or hole patterns have been formed in the interlayer insulating film, interconnection material is buried in the grooves and holes is recently used. The damascene process can easily form interconnection with low resistance materials, such as copper, etc., which are difficult for reactive etching, and is very effective to form low resistance interconnection having micronized pattern.

As the interconnections are more micronized, the interconnection spacing is also more decreased, and increased parasitic capacitance formed via the inter-layer insulating film is a cause for hindering the speed-up of semiconductor devices. Thus, several considerations have been made to utilize organic insulating materials (low-k materials) having dielectric constants lower than those of the conventionally used silicon oxide film and the silicon nitride film as the inter-layer insulating films. Parts of the organic materials have been already come in practice. Organic spin-on materials, such as an organic-based polymer called "SiLK" (registered trademark) from The Dow Chemical Company, and an organic-based polymer called "FLARE" (registered trademark) from Honeywell Electronic Materials, are known as the organic insulating materials.

Various studies have been made of semiconductor devices using organic insulating materials as the inter-layer insulating films, and conductors which are based on copper buried in the organic insulating films, and methods for fabricating the semiconductor devices.

The etching of organic insulating films still has more unknown points in the etching mechanism than that of silicon oxide-based insulating films. In the present environments, in etching organic insulating materials into vertically etching profile, the processing control by means of sidewall protection films is essential. In many cases of etching organic insulating materials containing no Si, such as the above-described SiLK, FLARE, etc., hydrogen-based (e.g., $H_2/N_2$, $NH_3$, etc) plasmas are used in place of fluorocarbon (CF)-based plasmas. In the etching using such gases, CN-based sidewall protection films are formed on etched surfaces, which make it possible to control cross-sectional etching profiles.

On the other hand, parallel plate dual frequency excitation etching systems are noted as etching systems suitable for the etching process for micronized devices of the next generation. The parallel plate dual frequency excitation etching system applies high frequencies of different frequencies to the lower electrode supporting a wafer and to the upper electrode opposed to the lower electrode to thereby excite plasma to etch the wafer. The parallel plate dual frequency excitation etching system is characterized by rapid, homogeneous and satisfactory etching under low pressure which have not been conventionally found, and little charge-up damage. The parallel plate dual frequency excitation etching system has high plasma generating efficiency, and can attain higher etching rates in comparison with the conventional etching systems. The etching of organic insulating films by using the parallel plate dual frequency excitation etching system is described in, e.g., in Japanese published unexamined patent application No. 2001-110784.

Problems of etching organic insulating films by the parallel plate dual frequency excitation etching system are bowing, and the corner loss of the hard mask. The bowing means the phenomena that side etching takes place at the middle of a hole to widen the hole diameter. The corner loss of the hard mask means the phenomena that the pattern edge of the hard mask used in etching organic insulating films are etched.

When the organic insulating films are etched by the parallel plate dual frequency excitation etching system, no bowing takes place in the etching processing using an $N_2/H_2$ gas, but amounts of the corner loss of the hard masks are large. On the other hand, in the etching process using an $NH_3$ gas, the amounts of the corner loss of the hard masks are small, but the bowing takes place.

FIGS. 21A and 21B are scanning electron microscope images showing cross-sectional etching profiles of samples each having a SiLK film and a silicon oxide film formed on a silicon oxide film in which the SiLK film is etched with the upper silicon oxide film as the hard mask. FIG. 21A shows the sample, which was etched with an $N_2/H_2$ gas. FIG. 21B shows the sample, which was etched with an $NH_3$ gas.

As shown in FIG. 21A, the sample etched with the $N_2/H_2$ gas has the corner of the silicon oxide film used as the hard mask etched, and it is seen that the corner loss took place. As shown in FIG. 21B, the sample etched with the $NH_3$ gas has the SiLK film etched even in the region below the silicon oxide film used as the hard mask, and it is seen that the bowing took place.

When a vertically etching profile is formed by etching, generally the bias electric power must be higher to increase ion energy so as to set an injection angle on a wafer vertical. However, the corner loss is increased as increasing the bias electric power. On the other hand, when etching conditions which decrease the corner loss amount of the hard mask are used, the isotropic etching component is increased, which increases the bow amplitude.

As described above, in etching an organic insulating film, the bow amplitude, and the corner loss amount of the hard mask trade off each other. It is difficult to make compatible with each other.

SUMMARY OF THE INVENTION

An object of the present invention is to provide a method for etching an organic insulating film which can form vertically etching profiles without little bowing and causes little corner loss of hard mask, and a method for fabricating the semiconductor device using the etching method.

According to one aspect of the present invention, there is provided a method for etching an organic insulating film in which a first RF power having a first frequency is applied to a first electrode with an object-to-be-processed having an organic insulating film mounted on, a second RF power having a second frequency different from the first frequency is applied to a second electrode opposed to the first electrode, whereby plasma of gas containing $NH_3$ is generated to etch the organic insulating film, the first RF power and the second RF power being controlled to make a Vpp value of a voltage applied to the first electrode below 500 V.

According to another aspect of the present invention, there is provided a method for fabricating a semiconductor device comprising the step of: sequentially forming an organic insulating film and an inorganic insulating film on a substrate; patterning the inorganic insulating film; and etching the organic insulating film with the patterned inorganic insulating film as a mask, in the step of etching the organic insulating film, a method for etching the organic insulating film in which a first RF power having a first frequency is applied to a first electrode with the substrate mounted on and a second RF power having a second frequency different from the first frequency is applied to a second electrode opposed to the first electrode, whereby plasma of gas containing $NH_3$ is generated to etch the organic insulating film being used, and the first RF power and the second RF power being controlled so as to make a Vpp value of a voltage to be applied to the first electrode below 500 V.

According to the present invention, in etching an organic insulating film by a parallel plate dual frequency excitation etching using a $NH_3$ gas, the Vpp voltage is below 500 V, the $NH_3$ flow rate is below 50 sccm, and the pressure in the plasma processing chamber is below 100 mTorr, whereby the organic insulating film cam be processed vertically while the bow amplitude and the corner loss amount of the hard mask can be decreased.

DETAILED DESCRIPTION OF THE INVENTION

[A First Embodiment]

The method for etching the organic insulating film according to a first embodiment of the present invention will be explained with reference to FIGS. 1 to 15C.

Figure 1:
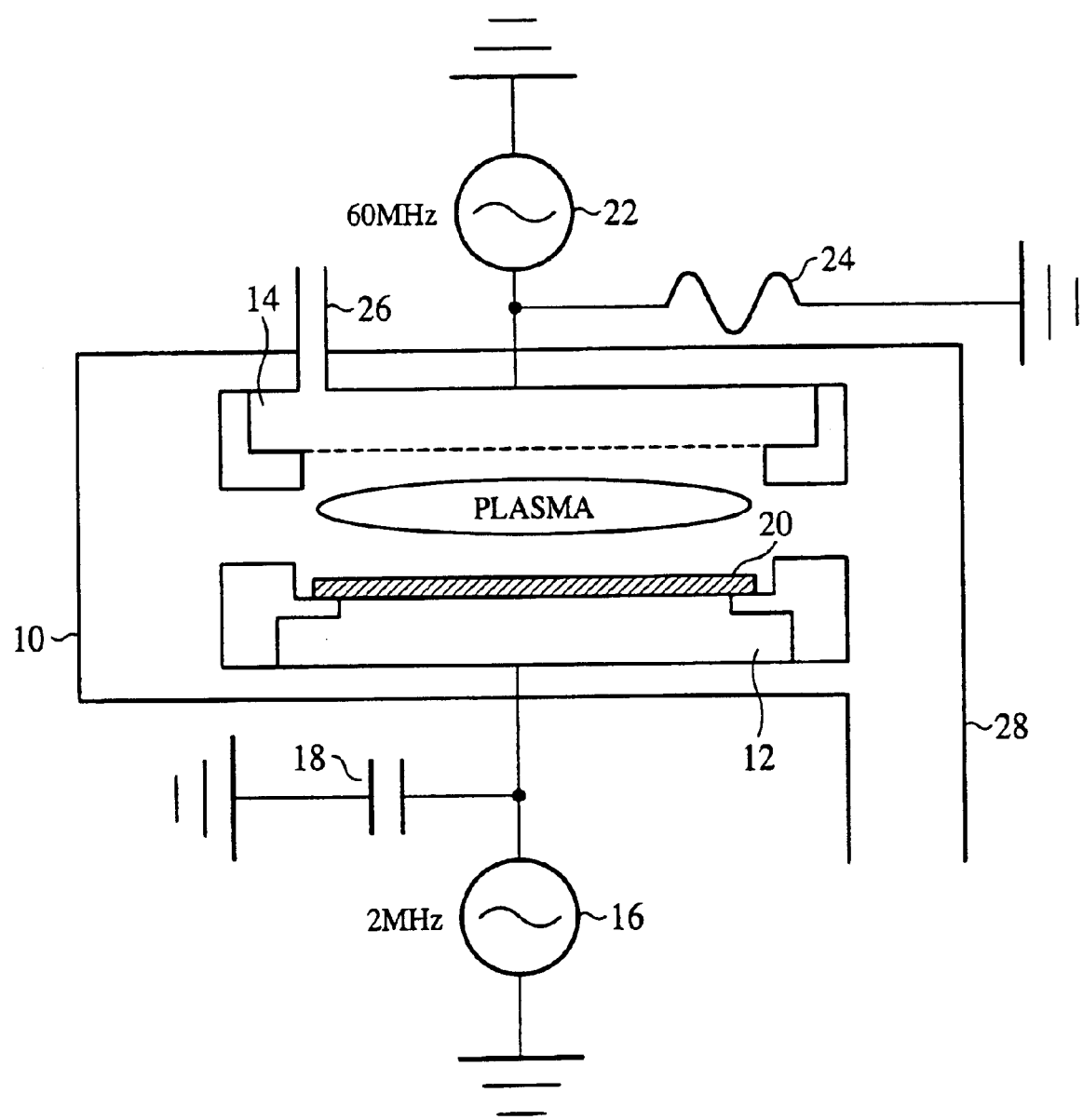
FIG. 1 is a diagrammatic view of the parallel plate dual frequency excitation etching system, which shows a structure thereof.
Figure 2:
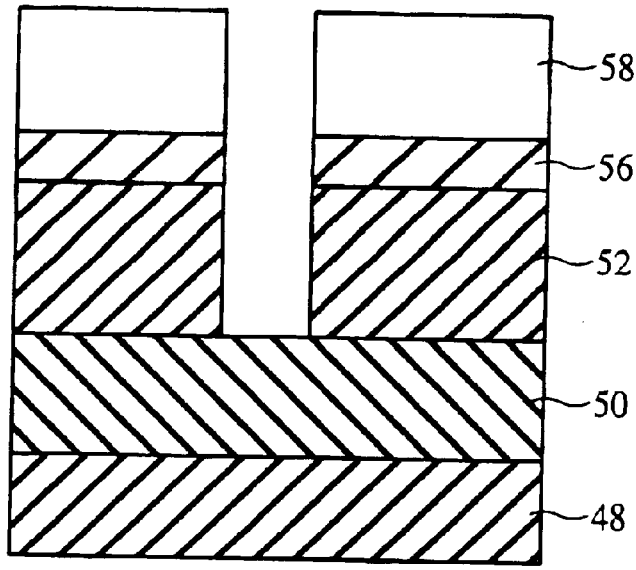
FIG. 2 is a diagrammatic sectional view of a sample used in the appreciation, which shows a structure thereof.
Figure 3:
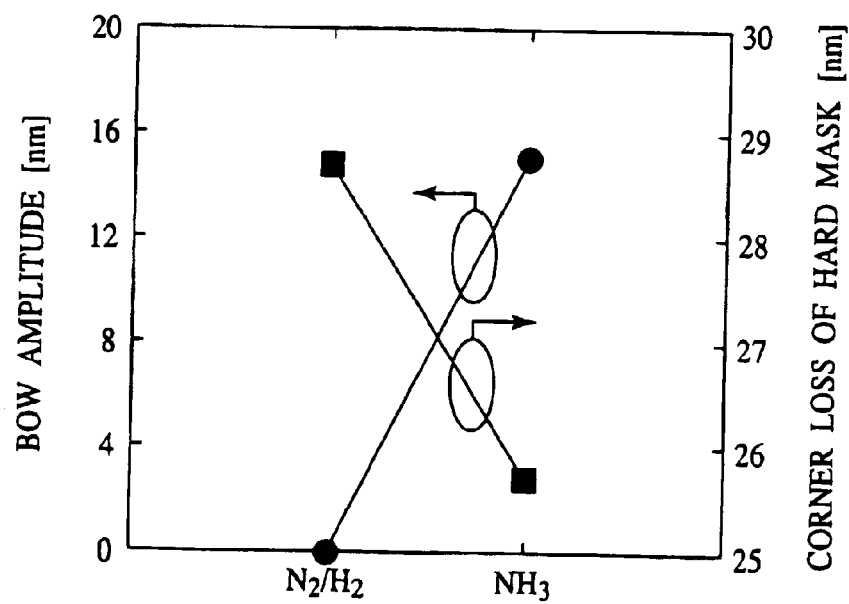
FIG. 3 is a graph showing etching gas dependency of the bow amplitudes and the corner loss of the hard mask.
Figure 4A:
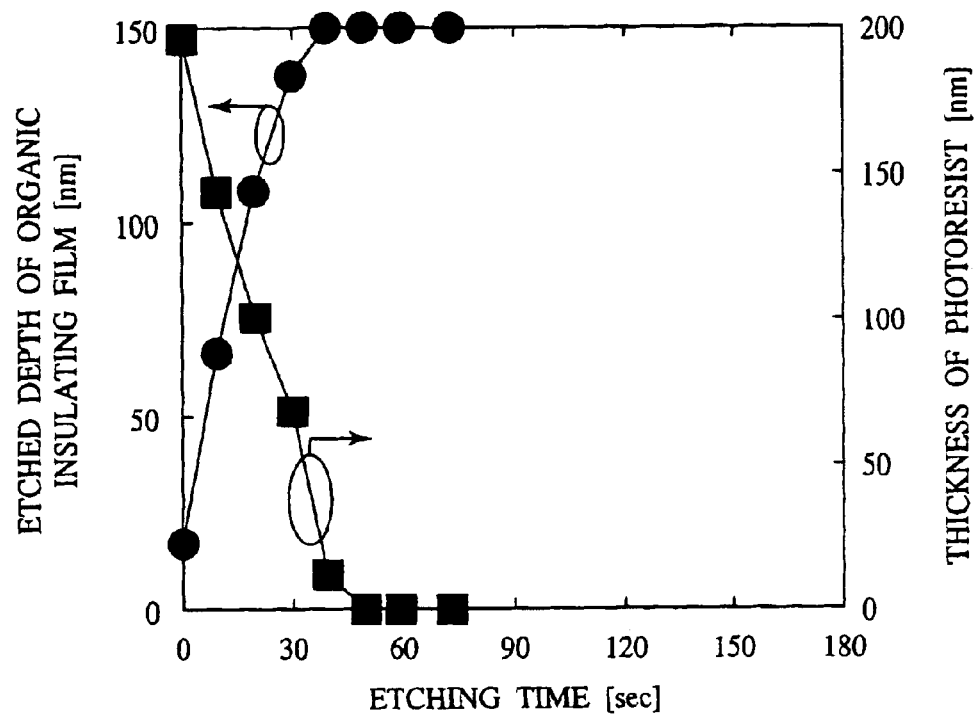
FIGS. 4A and 4B are graphs showing etching time dependency of various parameters in a case using $NH_3$ gas.
Figure 4B:
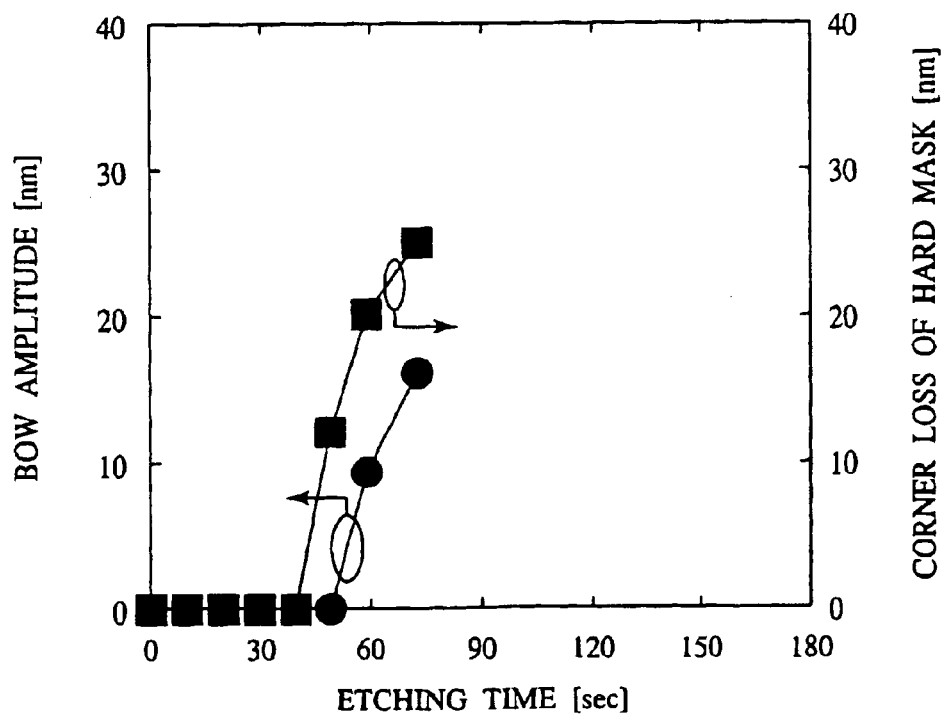
Figure 5A:
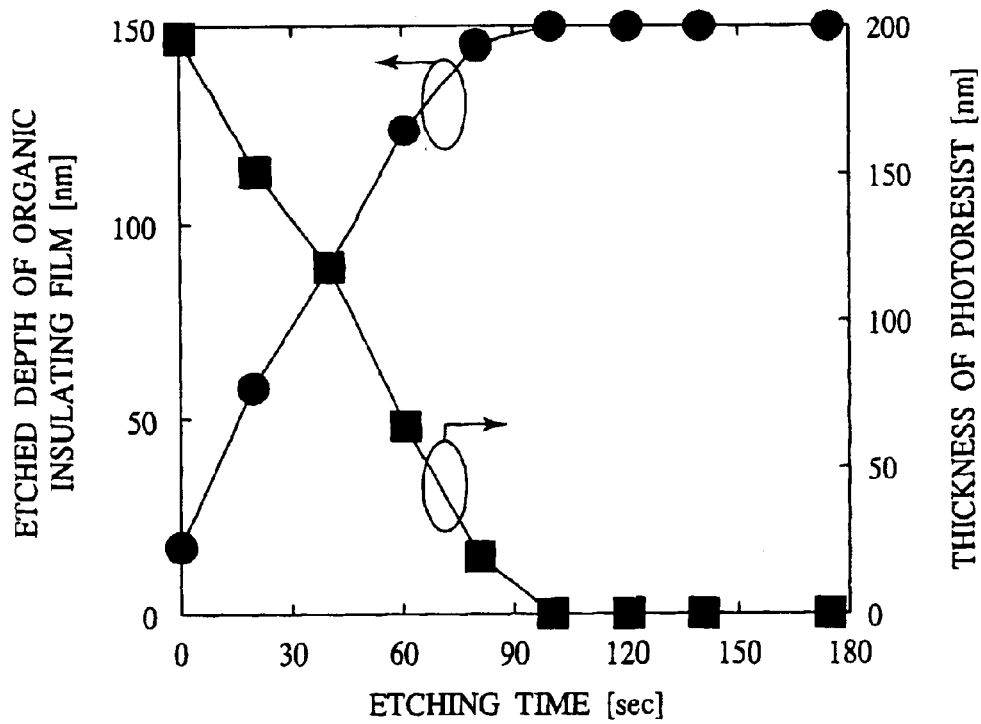
FIGS. 5A and 5B are graphs showing etching time dependency of various parameters in a case using $N_2/H_2$ gas.
Figure 5B:
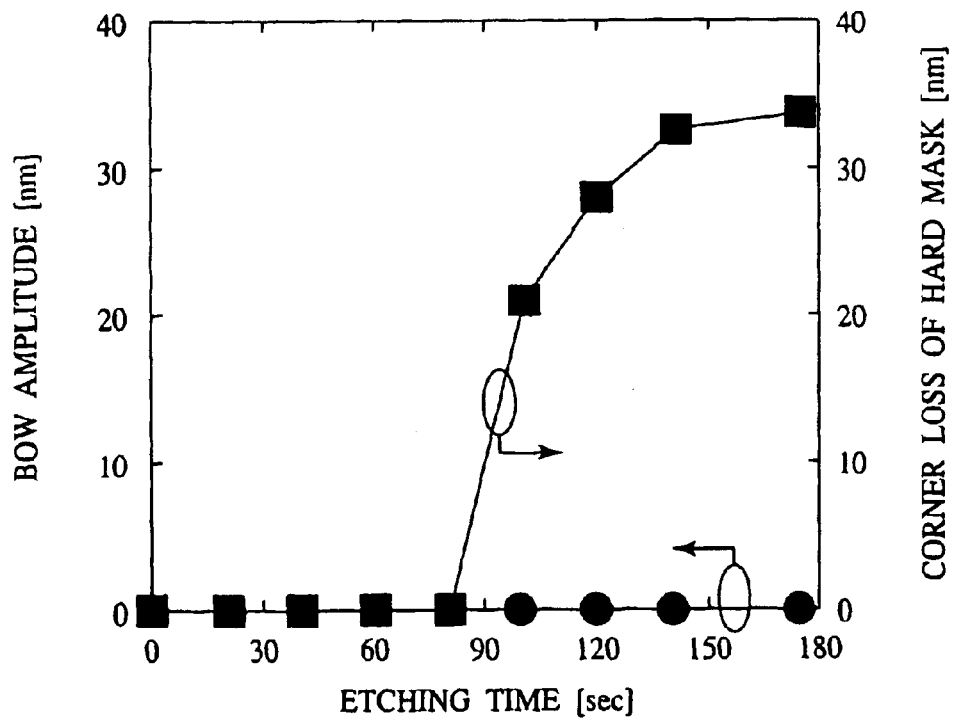
Figure 6:
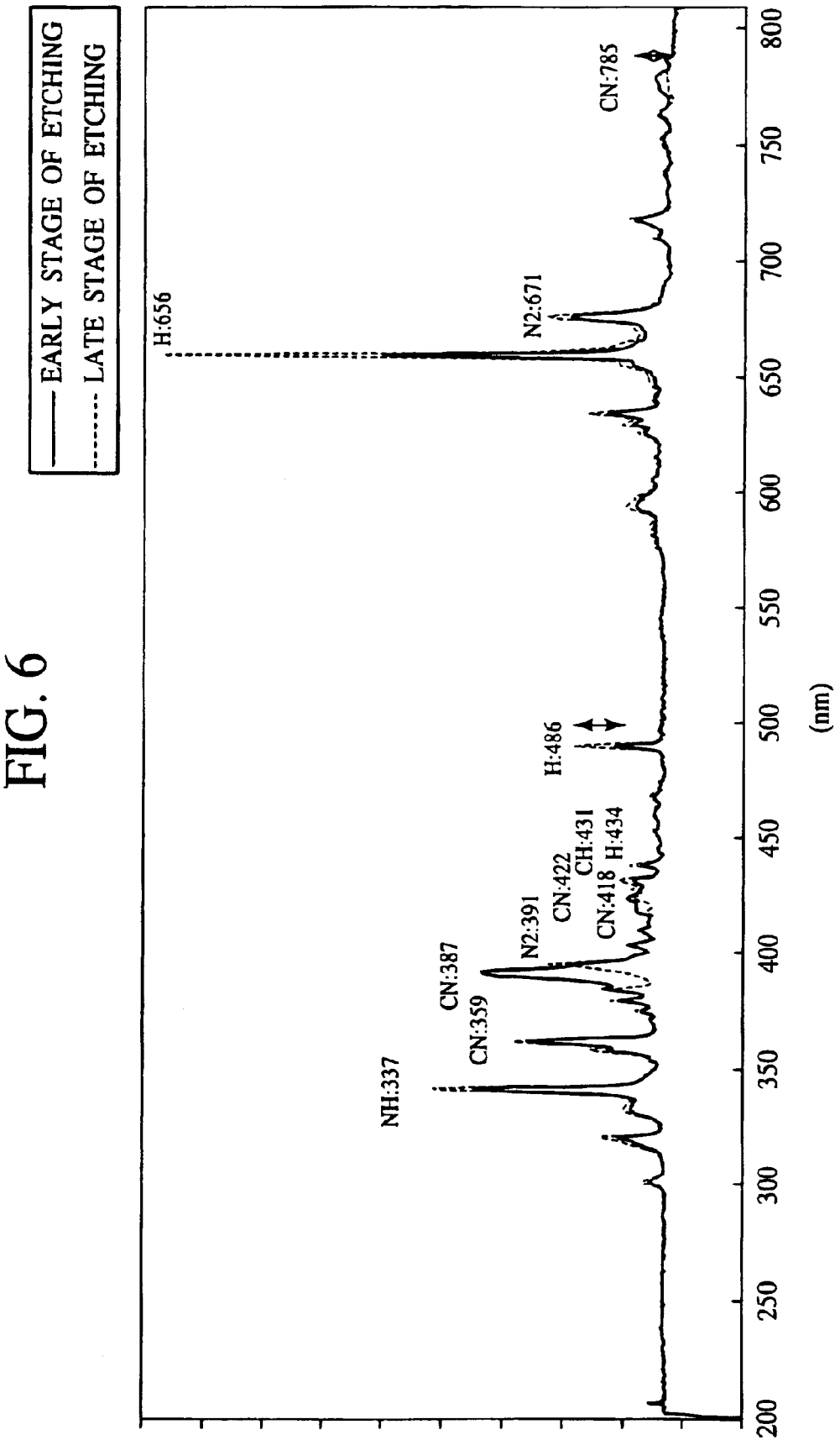
FIG. 6 is a graph showing the result of an emission spectral analysis of $NH_3$ plasmas.
Figure 7:
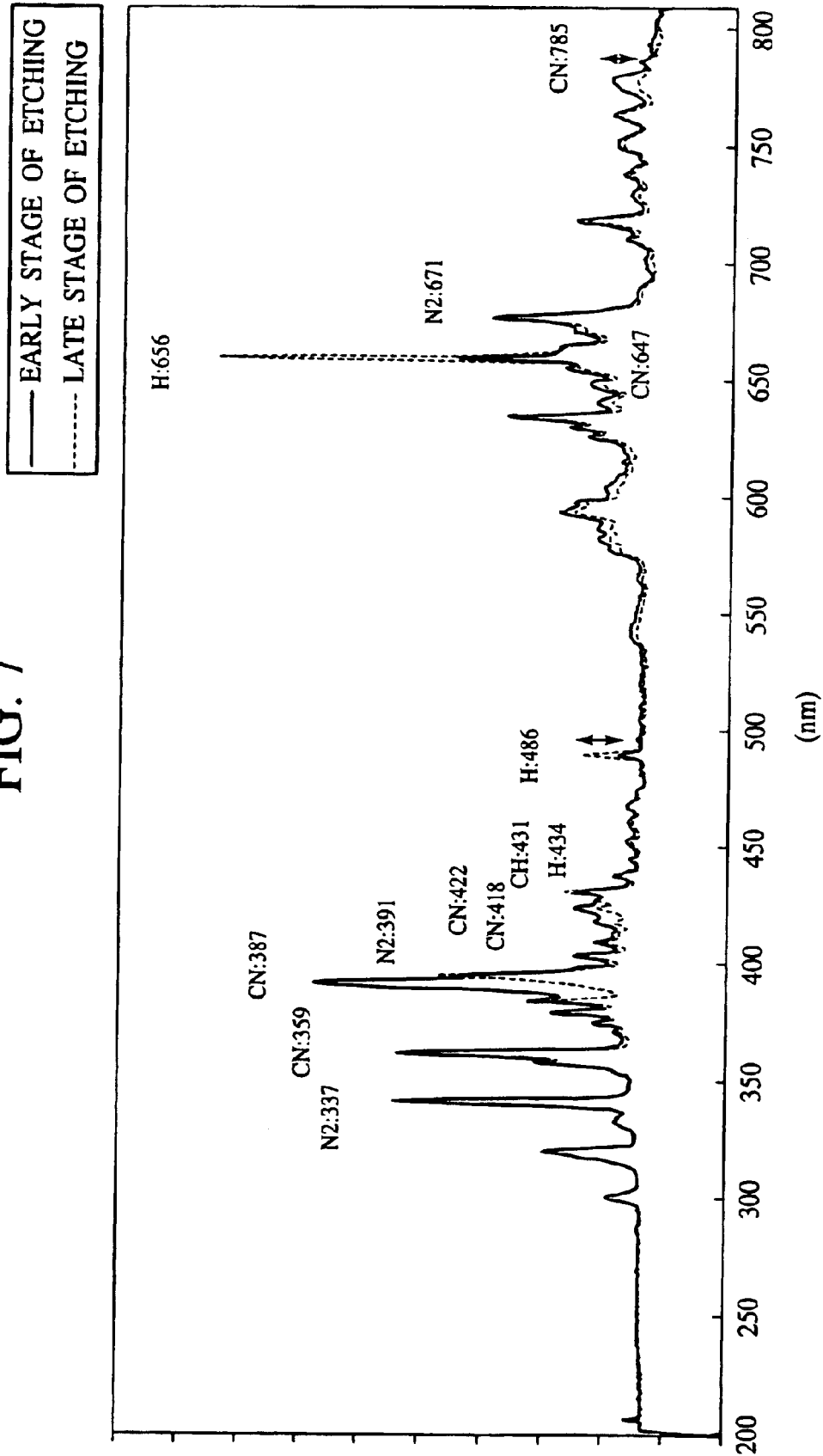
FIG. 7 is a graph showing the result of an emission spectral analysis of $N_2/H_2$ plasmas.
Figure 8A:
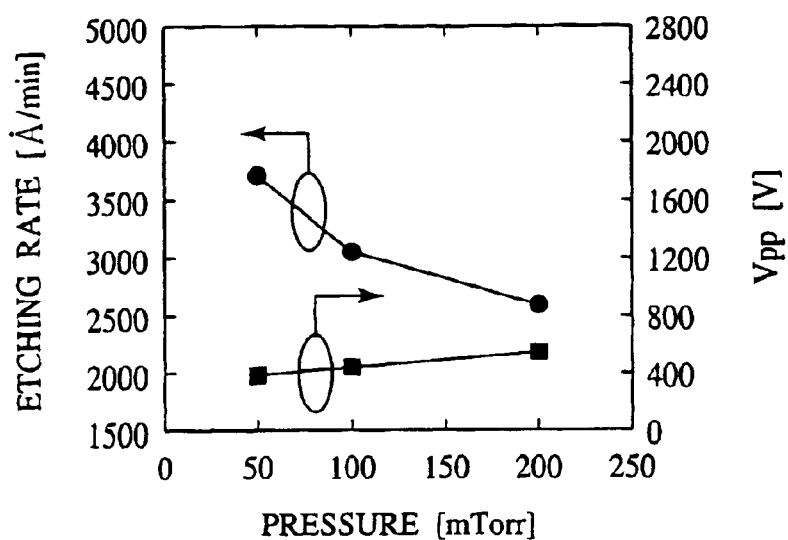
FIGS. 8A–8C are graphs showing relationships between etching rates and pressures in the plasma processing chamber.
Figure 8B:
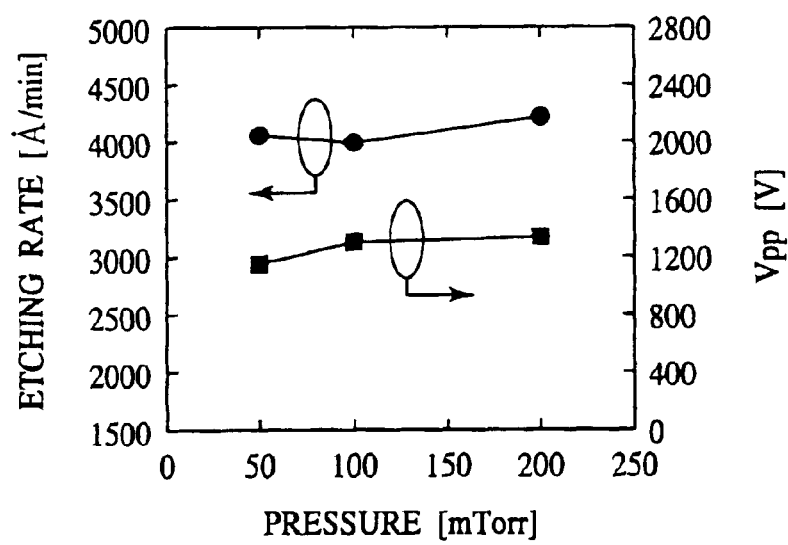
Figure 8C:
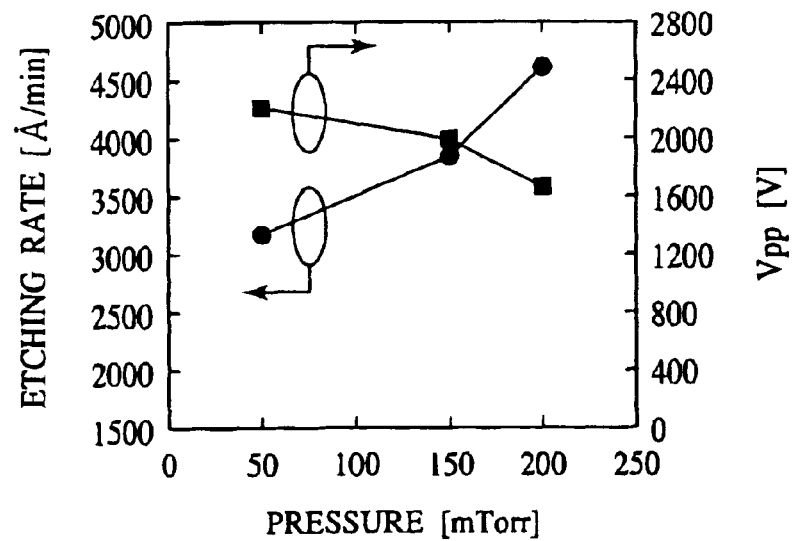
Figure 9A:
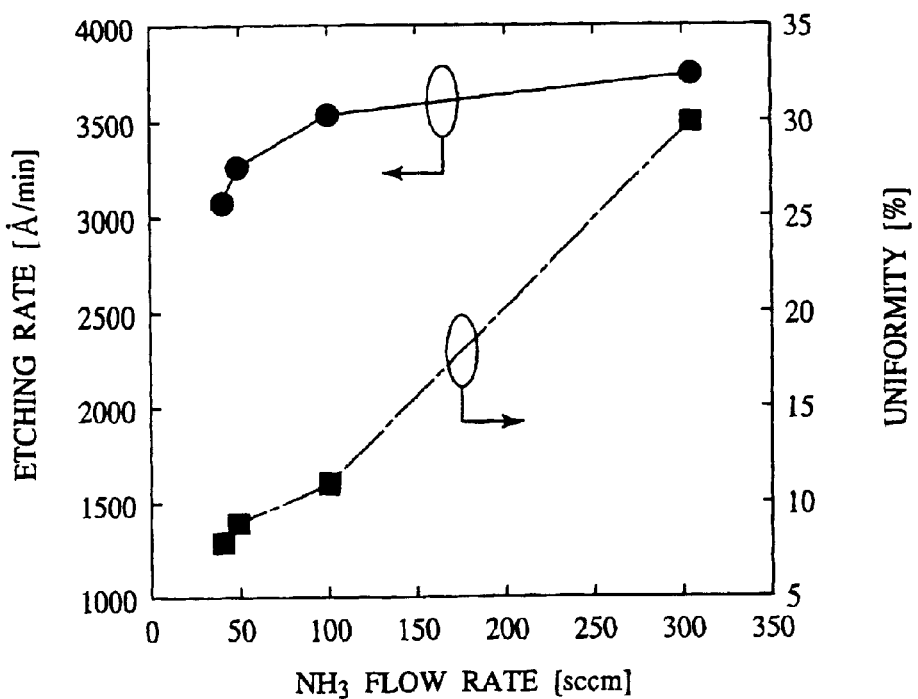
FIGS. 9A and 9B are graphs showing $NH_3$ flow rate dependency of etching rates, uniformity and Vpp voltages.
Figure 9B:
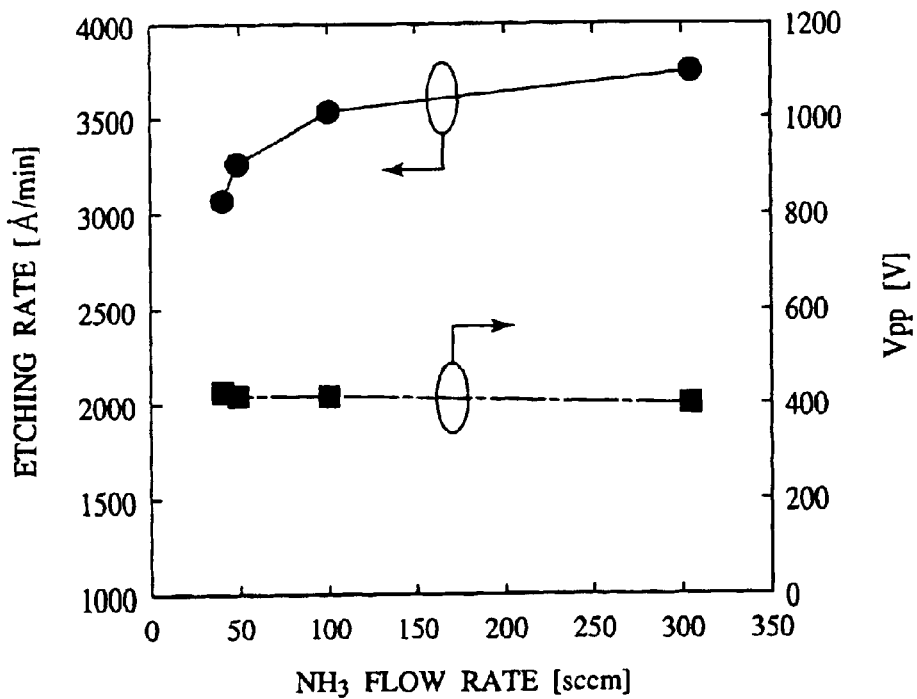
Figure 10:
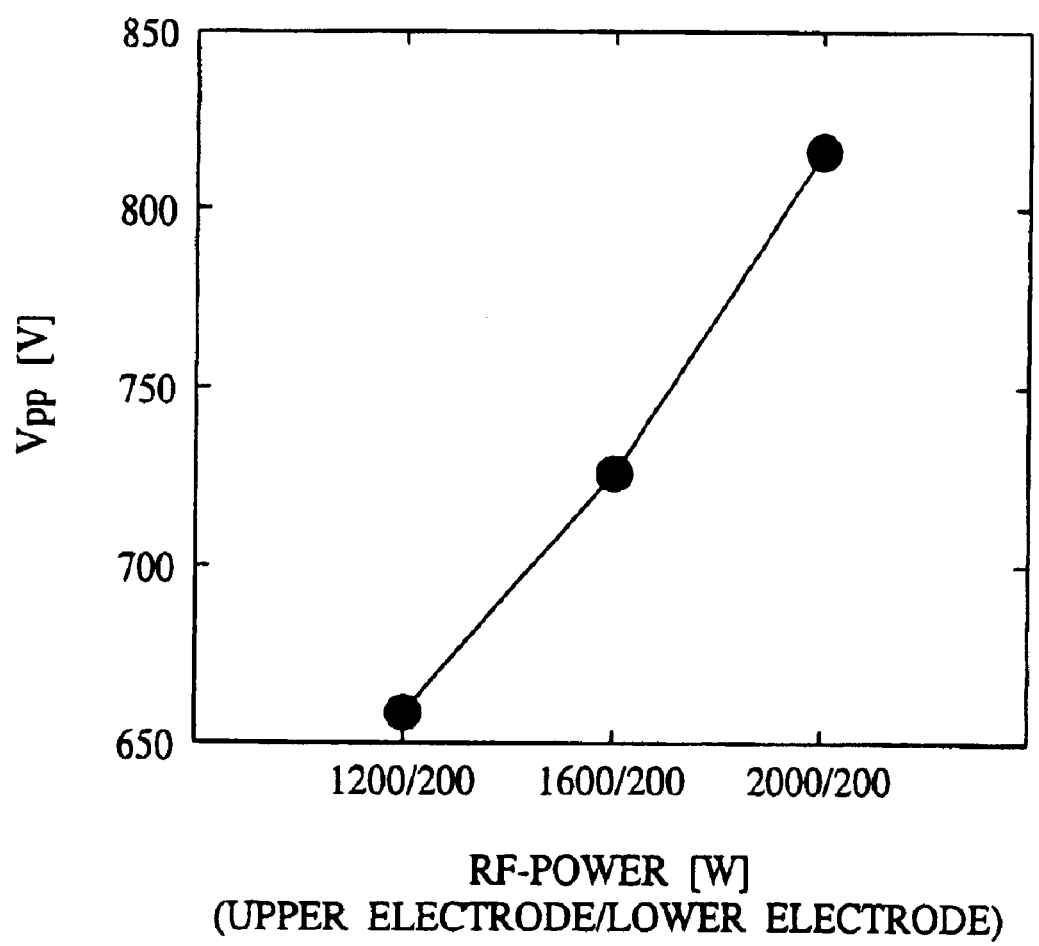
FIG. 10 is a graph showing applied RF-power dependency of Vpp voltage.
Figure 11:
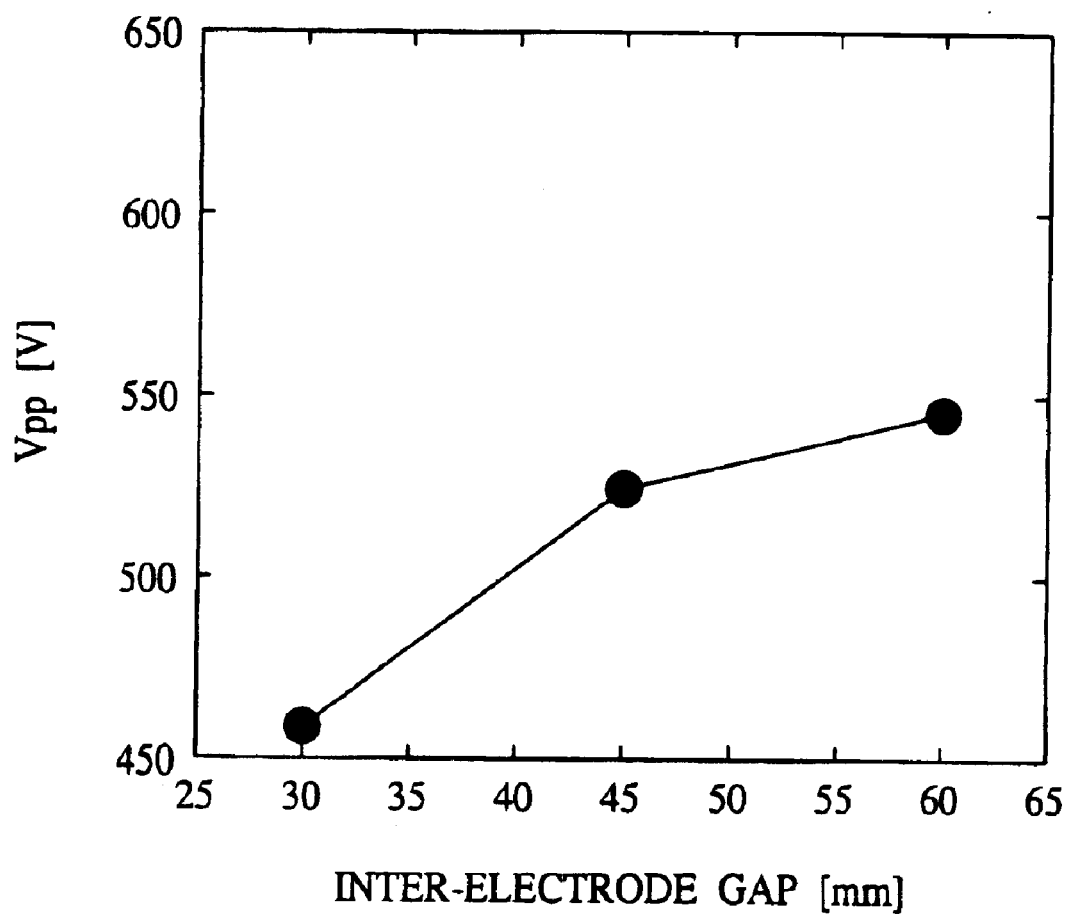
FIG. 11 is a graph showing inter-electrode gap dependency of Vpp voltage.
Figure 12:
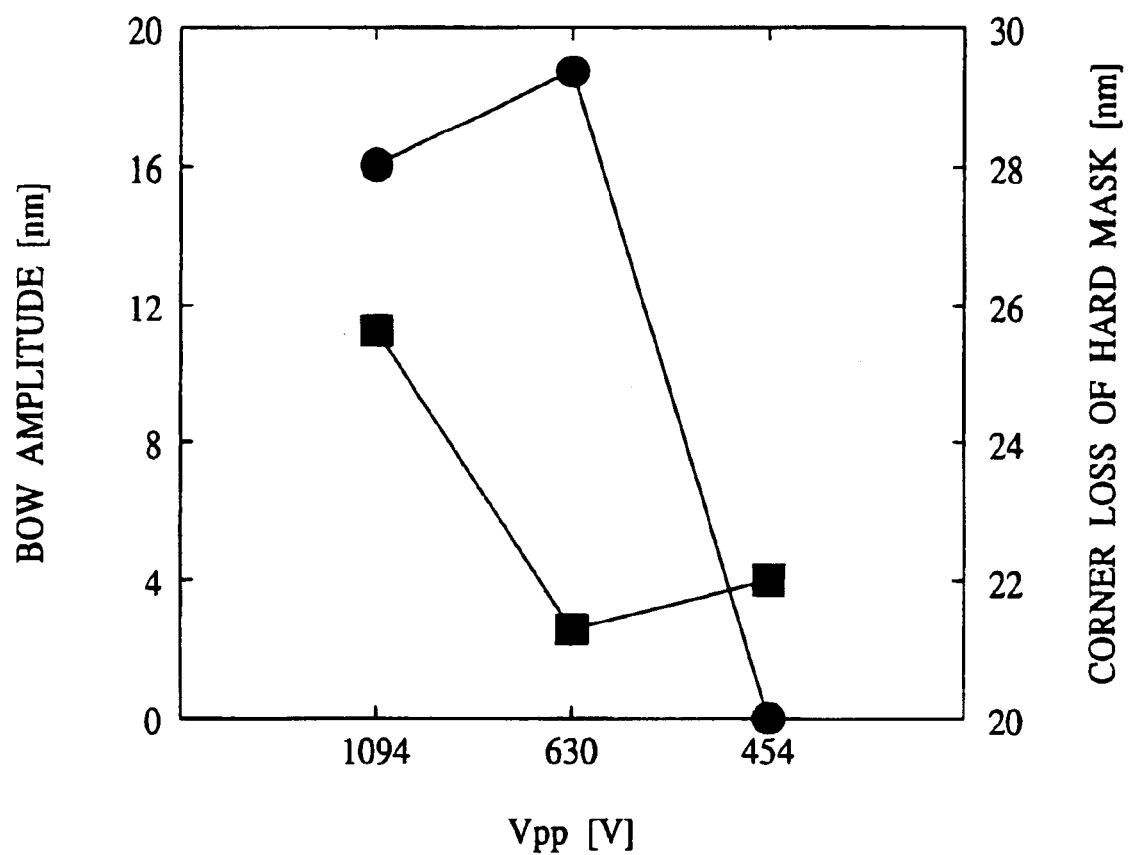
FIG. 12 is a graph showing Vpp voltage dependency of the bow amplitude and the corner loss of the hard mask.
Figure 13:
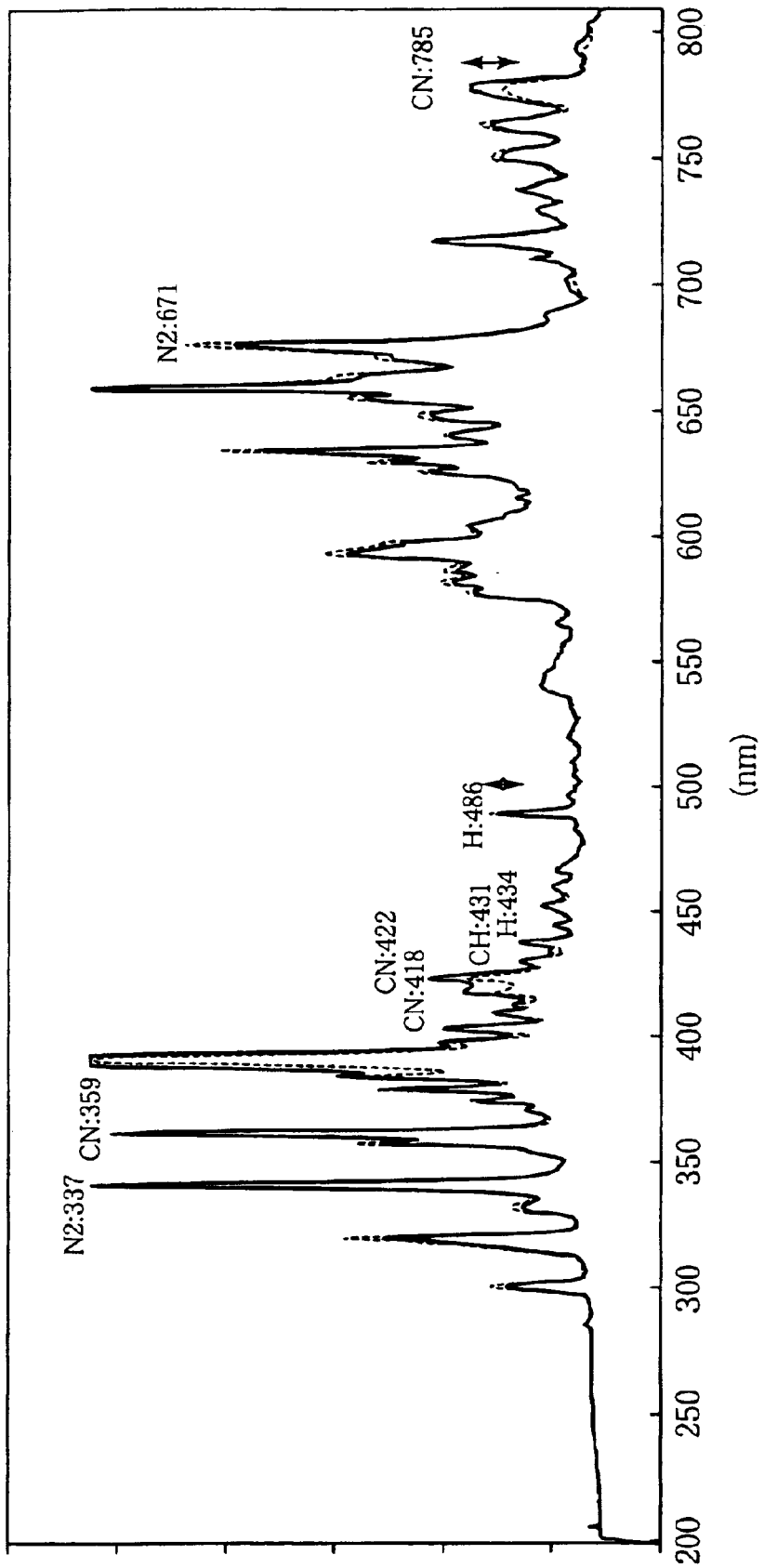
FIG. 13 is a graph showing the result of an emission spectral analysis of $NH_3$ plasma in the method for etching the organic insulating film according to a first embodiment of the present invention.
Figure 14A:
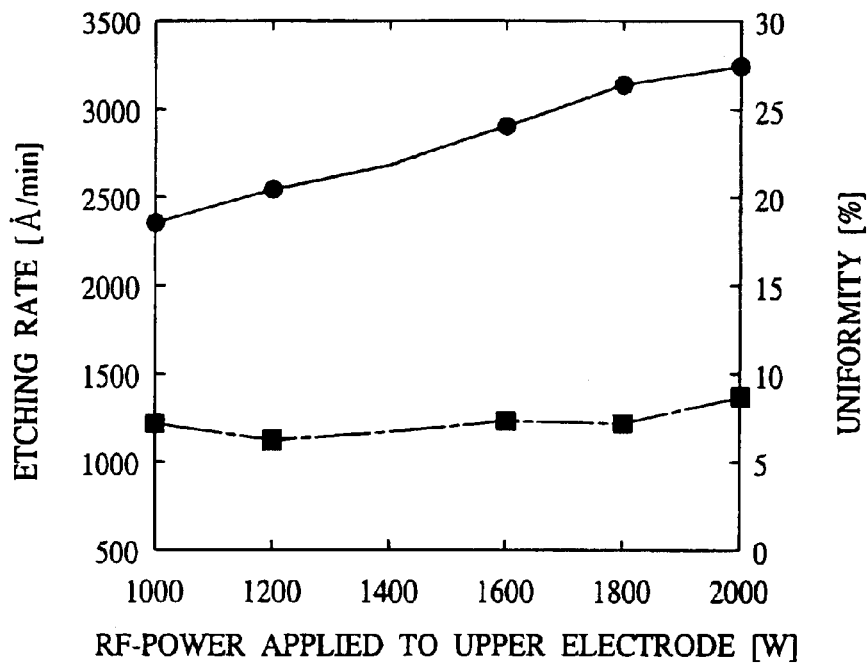
FIGS. 14A and 14B are graphs showing dependency of etching rates, uniformity and Vpp voltages on RF-powers applied to the upper electrode.
Figure 14B:
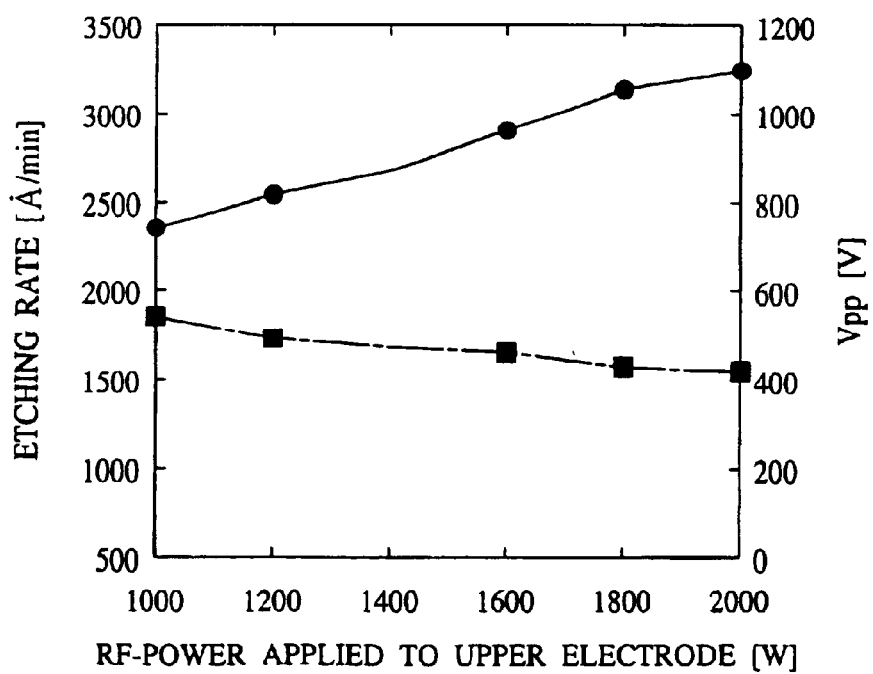
Figure 15A:
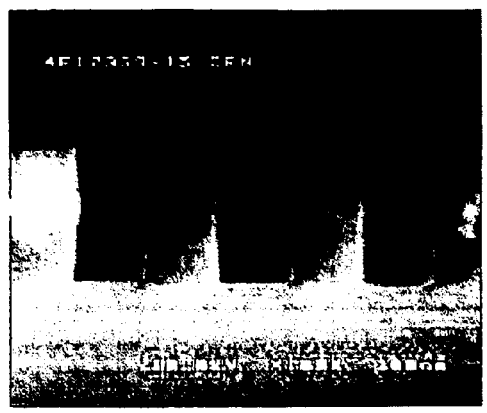
FIGS. 15A–15C are views showing influences of RF-powers applied to the upper electrode on cross-sectional etching profiles.
Figure 15B:
Figure 15C:
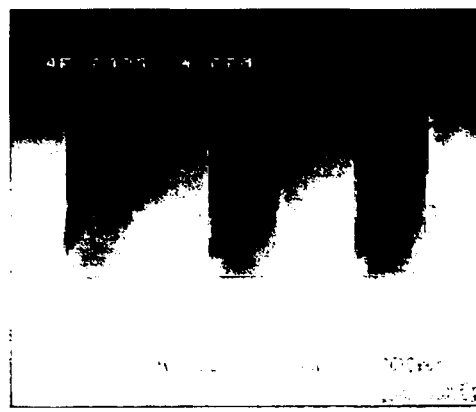

FIG. 1 is a diagrammatic view of the parallel plate dual frequency excitation etching system, which shows a structure thereof. FIG. 2 is a diagrammatic sectional view of a sample used in the appreciation, which shows a structure thereof. FIG. 3 is a graph showing etching gas dependency of the bow amplitudes and the corner loss of the hard mask. FIGS. 4A and 4B are graphs showing etching time dependency of various parameters in a case using the $NH_3$ gas. FIGS. 5A and 5B are graphs showing etching time dependency of various parameters in a case using the $N_2/H_2$ gas. FIG. 6 is a graph showing the result of an emission spectral analysis of $NH_3$ plasmas. FIG. 7 is a graph showing the result of an emission spectral analysis of $N_2/H_2$ plasmas. FIGS. 8A–8C are graphs showing relationships between etching rates and pressures in the plasma processing chamber. FIGS. 9A and 9B are graphs showing $NH_3$ flow rate dependency of etching rates, uniformity and Vpp voltages. FIG. 10 is a graph showing applied RF-power dependency of Vpp voltage. FIG. 11 is a graph showing inter-electrode gap dependency of Vpp voltage. FIG. 12 is a graph showing Vpp voltage dependency of the bow amplitude and the corner loss of the hard mask. FIG. 13 is a graph showing the result of an emission spectral analysis of $NH_3$ plasma in the method for etching the organic insulating film according to a first embodiment of the present invention. FIGS. 14A and 14B are graphs showing dependency of etching rates, uniformity and Vpp voltages on RF-powers applied to the upper electrode. FIGS. 15A–15C are views showing influences of RF-powers applied to the upper electrode on cross-sectional etching profiles.

First, the parallel plate dual frequency excitation etching system will be explained with reference to FIG. 1.

A lower electrode 12 and an upper electrode 14 opposed to the lower electrode 12 are disposed in a plasma processing chamber 10. The lower electrode 12 is connected to an RF power source 16 and a low-frequency filter 18, so that a high frequency, e.g., a 2 MHz high frequency, corresponding to a transmission band of the low frequency filter 18 can be applied to the lower electrode 12. A wafer 20, an object to be processed, can be mounted on the lower electrode 12. The upper electrode 14 is connected to an RF power source 22 and a high frequency filter 24, so that a high frequency, e.g., 60 MHz, corresponding to a transmission band of the high frequency filter 24 can be applied to the upper electrode 14. The upper electrode 14 also functions as a shower head for introducing etching gases into the plasma processing chamber 10, and the etching gases can be fed into the plasma processing chamber 10 through a gas feed pipe 26. The plasma processing chamber 10 is connected to an exhaust pipe 28.

Next, an outline of the method for etching the organic insulating film according to the present embodiment will be explained with reference to FIG. 1.

First, a wafer 20, an object to be processed, is mounted on the lower electrode 12, and the pressure in the plasma processing chamber 10 is reduced by a vacuum pump (not shown) connected to the exhaust pipe 28.

Then, an etching gas is introduced into the gas feed pipe 26 while the exhaust rate through the exhaust pipe 28 is controlled, whereby the pressure in the plasma processing chamber 10 is reduced to a prescribed value. At this time, the flow rate of $NH_3$, an etchant, is set to be below 50 sccm, e.g., to be 40 sccm, and the pressure in the plasma processing chamber 10 is set to be below 100 mTorr, e.g., to be 50 mTorr.

$N_2$ gas may be added to $NH_3$. The addition of the $N_2$ gas is more influential in protecting the sidewall. The influence in the sidewall protection will be described later.

Then, a high frequency of, e.g., 2 MHz is applied to the lower electrode 12 by the RF power source 16. A high frequency of, e.g., 60 MHz is applied to the upper electrode 14 by the RF power source 22. Thus, plasma is generated between the upper electrode 12 and the lower electrode 14.

The electric power to be applied to the lower electrode 12 is, e.g., 200 W. The electric power to be applied to the upper electrode 14 is, e.g., 1600 W. The inter-electrode gap is, e.g., 30 mm. These conditions are set so that the voltage Vpp is below 500 V. Here in the specification of the present application, the Vpp voltage or the Vpp value is a voltage value indicating a voltage difference between a maximum value of the high frequency voltage applied to the lower electrode 12 and a minimum value thereof, which is called a peak-to-peak voltage. With the conditions set as described above, the Vpp voltage is 454 V.

An organic insulating film formed on the wafer 20 is etched under these conditions, whereby a vertically etching profile can be formed while the bow amplitude and the corner loss of the hard mask are reduced.

As described above, the method for etching the organic insulating film according to the present embodiment is characterized mainly by etching using the $NH_3$ gas by the parallel plate dual frequency excitation etching system, in which the Vpp voltage is set to be below 500 V, the flow rate of the $NH_3$ is set below 50 sccm, and the pressure in the plasma processing chamber is set below 100 mTorr. Etching conditions are thus controlled, whereby an organic insulating material can be vertically processed with the bow amplitude and the corner loss of the hard mask decreased.

As the Vpp voltage, the $NH_3$ flow rate and the pressure in the plasma processing chamber are lower, the etching rate is lower. Accordingly, it is preferable that the lower limits of these parameters are controlled suitably in accordance with a required etching rate.

As the feed gas becomes thinner, the discharge becomes less stable, which makes it difficult to generate plasma and makes the impedance between the electrodes sensitive to variations of chamber exhaust rates. Thus, the lower limit values of the $NH_3$ flow rate and the pressure in the plasma processing chamber are determined in one aspect, depending on the exhaust capacity of the system in addition to the restriction of the etching rate.

Then, grounds for setting the etching conditions as described above will be explained with reference to the results of the studies by the inventors of the present application. In the studies made by the inventors of the present application, which will be described below, a sample comprising, as shown in FIG. 2, a 150 nm-thick organic insulating film 50 of SiLK, a 250 nm-thick silicon oxide film 52 as a hard mask, a 250 nm-thick BARC film 56 as an antireflection film, and a 133 nm-thick photoresist film 58 formed on a silicon oxide film 48 is used, and the organic insulating film 50 is etched with the patterned silicon oxide film 52, BARC film 56 and photo resist film 58 as a mask.

First, relationships between the blow amplitude and the corner loss amount of the hard mask, and the etching gases will be explained with reference to FIG. 3. FIG. 3 is a graph showing etching gas dependency of the bow amplitude and the corner loss amount of the hard mask.

As shown in FIG. 3, different tendencies are found in the bow amplitude and the corner loss amount of the hard mask between the uses of the $N_2/H_2$ gas and the use of the $NH_3$ gas as the etching gas. That is, in the etching process using the $N_2/H_2$ gas, no bowing takes place, but the corner loss amount of the hard mask is large. On the other hand, in the etching process using the $NH_3$ gas, the corner loss amount of the hard mask is small, but the bow amplitude is large.

FIG. 4A is a graph showing etching time dependency of the etched depth of the organic insulating film and the film thickness of the photoresist film in the case using the $NH_3$ gas. FIG. 4B is a graph showing etching time dependency of the bow amplitude and the corner loss amount of the hard mask in the case using the $NH_3$ gas.

FIG. 5A is a graph showing etching time dependency of the etched depth of the organic insulating film and the film thickness of the photoresist film in the case using the $N_2/H_2$ gas. FIG. 5B is a graph showing etching time dependency of the bow amplitude and the corner loss amount of the hard mask in the case using the $N_2/H_2$ gas.

As shown in FIGS. 4A and 4B, in the case using the $NH_3$ gas, the bowing of the organic insulating film starts to take place at the time when all the photoresist film has been removed. This will be because while the photoresist film is present, the CN-based deposition produced from the photoresist film acts as the sidewall protection film. The corner loss of the hard mask also starts to take place at the time when all the photoresist film has been removed.

On the other hand, as shown in FIGS. 5A and 5B, in the case using the $N_2/H_2$ gas, it is found that no bowing takes place, but the corner loss of the hard mask starts to take place at the time when all the photoresist film has been removed.

In order to clarify differences in the etching manner between the $NH_3$ gas and the $N_2/H_2$ gas described above, emission spectral analyses of plasmas of the respective gases were made. The results of the analyses are shown in FIGS. 6 and 7. FIG. 6 is a graph showing the result of the emission spectral analysis of $NH_3$ plasma. FIG. 7 is a graph showing the result of the emission spectral analysis of $N_2/H_2$ plasma. In the respective graphs, the solid lines indicate the states at the early stage of the etching, and the dotted lines indicate the state at the late stage of the etching.

In the respective graphs, when the wavelength (785 nm) of the CN, which acts as the sidewall protection film for the organic insulating film, and the wavelength (486 nm) of the H, which isotropically etches the organic insulating film are noted, the presence of the CN can be confirmed at the early stage of the etching owing to the presence of the photoresist film. At the late stage of the etching, because the photoresist film has been removed, the emission of the CN is absent, and the emission of the H is intense.

Here, it is considered that as the CN, which acts as the sidewall protection film, is more, the bowing is smaller. It is considered that as the H, which contributes to the isotropic etching, is less, the bowing is smaller. When the CN amount and the H amount are considered from such viewpoint, it is considered that as a ratio of a CN amount at the early stage of the etching and an H amount at the late stage of the etching (hereinafter called a CN/H ratio) is larger, the bowing amplitude is smaller.

In the graph of FIG. 6, the CN/H ratio is about 0.16, and in the graph of FIG. 7, the CN/H ratio is about 0.655, i.e., the CN/H ratio of the $N_2/H_2$ plasma is larger than that of $NH_3$ plasma, which can endorse the above-described assumption. Accordingly, it is considered that if the CN/H ratio can be made small, the $NH_3$ plasma can decrease the bow amplitude.

Then, various studies were made of etching conditions which can make the CN/H ratio small in the case using the $NH_2$ gas.

First, relationships between the etching rate, and the Vpp voltage and the pressure in the plasma processing chamber 10 are shown. FIGS. 8A–8C are graphs showing relationships between the etching rate and the pressure in the plasma processing chamber 10. FIG. 8A shows their relationships given when the RF power applied to the lower electrode 12 was 200 W, the RF power applied to the upper electrode was 2000 W, and the inter-electrode gap was 30 mm. FIG. 8B shows their relationships given when the RF power applied to the lower electrode 12 was 700 W, the RF power applied to the upper electrode was 1000 W, and the inter-electrode gap was 45 mm. FIG. 8C shows their relationships given when the RF power applied to the lower electrode 12 was 1000 W, the RF power applied to the upper electrode was 200 W, and the inter-electrode gap was 45 mm. The flow rate (300 sccm) of the $NH_3$ gas and the substrate temperature (30° C.) are common in all the cases. In the respective graphs, the solid lines indicate the etching rates, and the one-dot-chain lines indicate the Vpp voltages.

As shown in FIG. 8C, when the RF power applied to the lower electrode 12 is sufficiently higher than that applied to the upper electrode 14, the etching rate lowers as the pressure in the plasma processing chamber 10 is decreased. The Vpp voltage increases as the pressure in the plasma processing chamber 10 is decreased.

As shown in FIG. 8B, when the RF power applied to the lower electrode 12 is a little higher than that applied to the upper electrode 14, the dependency of the etching rate and Vpp voltage on the pressure in the plasma processing chamber 10 is decreased.

In contrast to this, as shown in FIG. 8A, the RF power applied to the upper electrode 14 is sufficiently higher than that applied to the lower electrode 12, the etching rate is increased as the pressure in the plasma processing chamber 10 is decreased. The Vpp voltage decreases as the pressure in the plasma processing chamber 10 is lowered.

Lowering the pressure in the plasma processing chamber 10 reduces the scattering of the ions, and the injection angles of the ions are more vertical. This permits a vertically etching profile to be formed. Lowering the Vpp voltage allows the etching to be performed at low injection energy, and the corner loss amount of the hard mask can be decreased. Accordingly, making the RF power applied to the upper electrode 14 higher than that applied to the lower electrode 12 will be effective to decrease the bowing amplitude and the corner loss amount of the hard mask.

FIGS. 9A and 9B are graphs showing the $NH_3$ flow rate dependency of the etching rate, the uniformity and the Vpp voltage. FIG. 9A is the graph showing the $NH_3$ flow rate dependency of the etching rate and the uniformity. FIG. 9B is the graph showing the $NH_3$ flow rate dependency of the etching rate and the Vpp voltage. The RF power applied to the lower electrode 12 was 200 W. The RF power applied to the upper electrode was 2000 W, the pressure in the plasma processing chamber 10 was 50 mTorr, the inter-electrode gap was 30 mm, and the substrate temperature was 30° C. In FIG. 9A, the solid line indicates the etching rate, and the one-dot-line indicates the uniformity. In FIG. 9B, the solid line indicates the etching rate, and the one-dot-line indicates the Vpp voltage.

As shown in FIG. 9A, lowering the $NH_3$ flow rate much improves the uniformity. Under conditions of high RF power applied to the upper electrode 14 and low pressure, there is a risk that the plasma distribution may be disuniform. However, lowering the $NH_3$ flow rate can drastically improve the uniformity.

Lowering the flow rate of the $NH_3$, which is the etchant, means lowering the etching rate. However, as shown in FIG. 9A, the decrease of the etching rate by lowering the $NH_3$ flow rate from 300 sccm to 50 sccm is about 10%. In consideration of the above-described uniformity improving effect, the influence on the etching rate can be said to be sufficiently little.

As shown in FIG. 9B, the variation of the Vpp voltage involved in lowering the $NH_3$ flow rate is small. Lowering the $NH_3$ flow rate can result in the generation of a decreased number of ions, and the corner loss amount of the hard mask can be made small.

Thus, lowering the $NH_3$ flow rate can improve the uniformity while the above-described effects produced by making the RF power applied to the upper electrode 14 higher than that applied to the lower electrode 12 are maintained.

FIG. 10 is a graph showing the applied RF power dependency of the Vpp voltage. The RF power [W] applied to the lower electrode 12/the RF power [W] applied to the upper electrode 14 is taken on the horizontal axis. The $NH_3$ flow rate was 200 sccm, and the inter-electrode gap was 30 mm.

FIG. 11 is a graph showing the inter-electrode gap dependency of the Vpp voltage. The RF power applied to the lower electrode was 200 W, the RF power applied to the upper electrode was 2000 W, and the $NH_3$ flow rate was 300 sccm.

As shown in FIGS. 10 and 11, the Vpp voltage depends on the RF powers applied to the lower electrode 12 and the upper electrode 14, the inter-electrode gap, etc. This is because the Vpp voltage is dependent on the impedance of the plasma, etc. in the plasma processing chamber 10. Supplementally, when the inter-electrode gap is decreased, the plasma is more dissociated, and the Vpp voltage lowers. This phenomenon is similar to the state that the plasma is more dissociated by applying a higher RF power to the upper electrode. Accordingly, defining the Vpp voltage inevitably determines a process window.

FIG. 12 is a graph showing Vpp voltage dependency of the bow amplitude and the corner loss amount of the hard mask. The measured sample was prepared under the etching conditions that the RF power applied to the lower electrode was 200 W, the RF power applied to the upper electrode was 1600 W, the $NH_3$ flow rate was 40 sccm, and the pressure in the plasma processing chamber was 50 mTorr. The Vpp voltage at this time was 454 V.

Figure 21A:
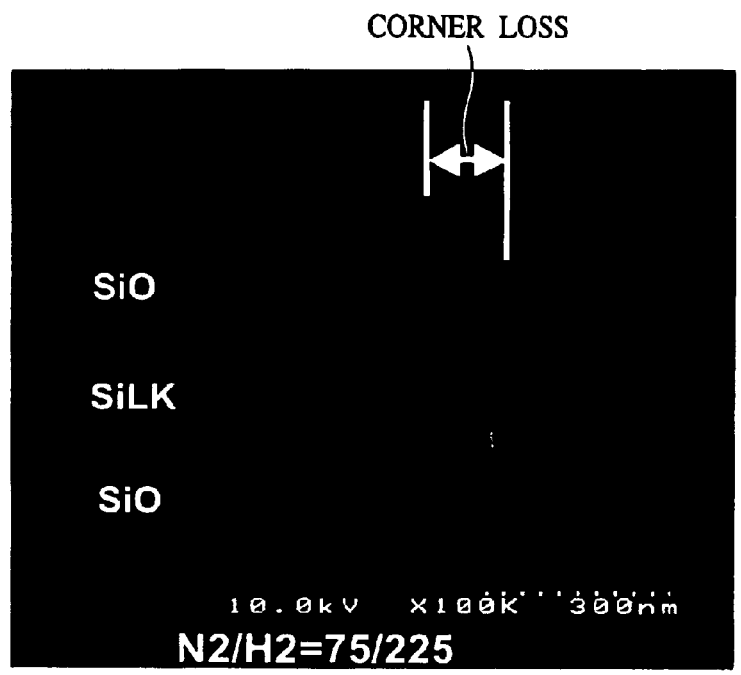
FIGS. 21A and 21B are views showing the corner loss of the hard mask and the bowing.
Figure 21B:
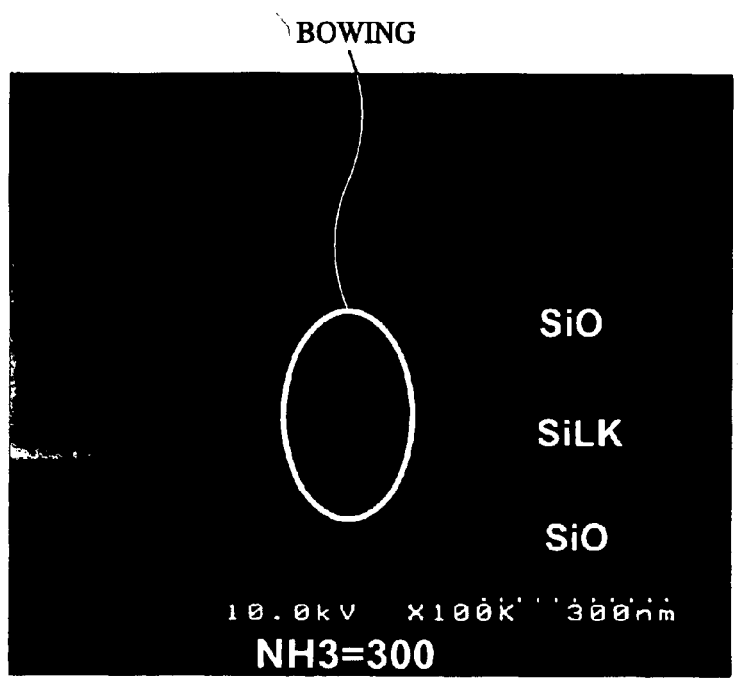

The values of the bow amplitude shown in FIG. 12 are etched amounts of the organic insulating film measured horizontally from the end of the hard mask. The values of the corner loss amount are widths of the etched regions of the hard mask measured from the end of the hard mask as indicated by the arrows in FIG. 21A.

As shown in FIG. 12, the bow amplitude and the corner loss amount of the hard mask can be much decreased by suppressing the Vpp voltage to be below about 500 V.

As described above, the RF powers applied to the upper and the lower electrodes, the inter-electrode gap and the pressure in the plasma processing chamber are reflected on the Vpp voltage. Accordingly, the Vpp voltage is defined to thereby determine a process window. Lowering the pressure in the plasma processing chamber under the conditions which lower the Vpp voltage much influences the etching profile control. Lowering the $NH_3$ flow rate much influences the uniformity, and is effective to reduce the corner loss amount of the hard mask. To be specific, it is preferable to set the Vpp voltage to be below about 500 V, the pressure in the plasma processing chamber to be below 100 mTorr and the $NH_3$ flow rate to be below 50 sccm.

FIG. 13 is a graph showing the results of emission spectral analysis of the $NH_3$ plasma in the case that the RF power applied to the lower electrode was 200 W, the RF power applied to the upper electrode was 1600 W, the $NH_3$ flow rate was 40 sccm, and the pressure in the plasma processing chamber was 50 mTorr.

As shown, also in the $NH_3$ gas, the CN/H ratio can be 3.9 by setting the Vpp voltage to be below about 500 V, the pressure in the plasma processing chamber to be below 100 mTorr and the $NH_3$ flow rate to be below 50 sccm. The value can be much larger than that of the $N_2/H_2$ plasmas. This result can also endorse the effect of reducing the bow amplitude in FIG. 12.

FIGS. 14A and 14B are graphs showing the dependencies of the etching rate, the uniformity and the Vpp voltage on the RF power applied to the upper electrode. FIG. 14A is the graph showing the dependencies of the etching rate and the uniformity. FIG. 14B is the graph showing the dependencies of the etching rate and the Vpp voltage.

FIGS. 15A–15C are views showing influences of the RF power applied to the upper electrode on cross-sectional etching profiles. FIG. 15A shows the influence in the case that the RF power applied to the upper electrode was 1200 W in FIG. 14. FIG. 15B shows the influence in the case that the RF power applied to the upper electrode was 1600 W in FIG. 14. FIG. 15C shows the influence in the case that the RF power applied to the upper electrode is 2000 W.

For the sample shown in FIGS. 14A to 15C, the rest etching conditions are set as follows. The RF power applied to the lower electrode was 200 W, the inter-electrode gap was 30 mm, the $NH_3$ flow rate was 50 sccm, the pressure in the plasma processing chamber was 50 mTorr, and the substrate temperature was 30° C.

As shown in FIGS. 14A and 14B, the value of the RF power applied to the upper electrode influences the etching rate but does not much influence the uniformity and the Vpp voltage, that is, little influences the bowing and the corner loss of the hard mask.

In contrast to this, as shown in FIGS. 15A–15C, the value of the RF power applied to the upper electrode influences the cross-sectional etching profile, and higher RF powers tend to form forwardly tapered configurations. The shown examples of FIGS. 15A and 15B have substantially vertical configurations, and the shown example of FIG. 15C has a forwardly tapered configuration.

Based on the results shown in FIGS. 14A to 15C, the value of the RF power applied to the upper electrode is controlled, whereby the cross-sectional etching profiles can be controlled while the bow amplitude and the corner loss amount of the hard mask are suppressed.

As described above, according to the present embodiment, in the etching of an organic insulating film by the parallel plane dual frequency excitation etching system using the $NH_3$ gas, the Vpp voltage is set to be below 500 V, the $NH_3$ flow rate is set to be below 50 sccm, the pressure in the plasma processing chamber is set to be below 100 mTorr, whereby the organic insulating film can be vertically processed while the bow amplitude and the corner loss of the hard mask are decreased.

In the present embodiment, the RF power applied to the lower electrode is 2 MHz, which is relatively low frequency, and the Vpp voltage is set to be below 500 V. When the RF power of higher frequency is used, the influence of the Vdc voltage is unignorable. In such case, the value of Vpp+Vdc is as significant as the value of the Vpp voltage.

[A Second Embodiment]

The method for fabricating the semiconductor device according to a second embodiment of the present invention will be explained with reference to FIGS. 16A to 20B.

FIGS. 16A to 20B are sectional views of the semiconductor device in the steps of the method for fabricating the semiconductor device according to the present embodiment, which show the method.

In the present embodiment, the method for etching the organic insulating film according to the first embodiment is applied to the method for fabricating the semiconductor device having interconnections of a dual damascene structure. The method for etching organic insulating film according to the first embodiment is applicable widely to the method for fabricating the semiconductor device having step of etching the organic insulating film and is not limited to the method for fabricating the semiconductor device having the structure shown in the present embodiment.

First, a silicon oxide film 32 of, e.g., a 280 nm-thick is formed on a substrate 30 by, e.g., plasma CVD method. In the specification of the present application, the substrate 10 includes not only base semiconductor substrate, but also semiconductor substrate having transistors and other elements, and interconnection layers formed on.

Then, an organic insulating film 34 of, e.g., a 100 nm-thick is formed on the silicon oxide film 32 by, e.g., spin coating method. The organic insulating film 34 can be of, e.g., SiLK by The Dow Chemical Company. In place of SiLK, FLARE by Honeywell Electronic Materials or others may be used. Other organic insulating materials, such as hydrocarbon-content resins, fluorine-content resins, silicon oxycarbide, etc., may be used. Stacked films of arbitrary ones of these organic insulating materials may be used.

Then, a silicon oxide film 36 of, e.g., a 150 nm-thick is formed on the organic insulating film 34 by, e.g., plasma CVD method.

Next, a photoresist film (not shown) exposing a region for an interconnection groove to be formed in is formed on the silicon oxide film 36 by photolithography.

Then, with the photoresist film as a mask, the silicon oxide film 36 and the organic insulating film 34 are anisotropically etched to form an interconnection groove 38 in the silicon oxide film 36 and the organic insulating film 34.

The silicon oxide film 36 is etched by the usual plasma etching using a CF-based etching gas.

The organic insulating film 34 can be etched by the method for etching the organic insulating film according to the first embodiment. The RF power applied to the lower electrode is 200 W, the RF power applied to the upper electrode is 1600 W, the $NH_3$ flow rate is 40 sccm, the pressure in the plasma processing chamber is 50 mTorr, the inter-electrode gap is 30 mm, and the substrate temperature is 30° C., whereby the organic insulating film 34 can be etched while the bowing and the corner loss of the silicon oxide film 36 as the hard mask are prevented.

Figure 16A:
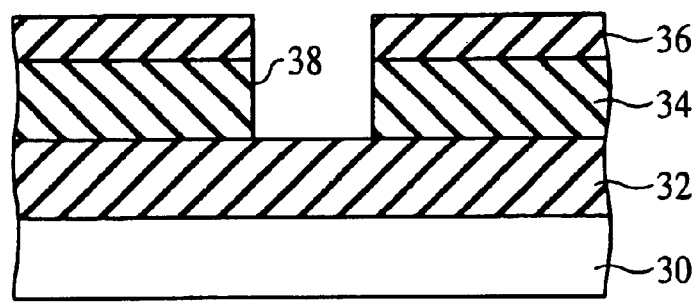
FIGS. 16A–16C, 17A–17B, 18A–18B, 19A–19B and 20A–20B are sectional views of a semiconductor device in the steps of the method for fabricating the semiconductor device according to a second embodiment of the present invention.

Thus, the interconnection groove 38 is formed in the inter-layer insulating film of the organic insulating film 34 and the silicon oxide film 36 is thus formed (FIG. 16A).

Concurrently with etching the organic insulating film 34, the photoresist film used in etching the silicon oxide film 36 is removed.

Then, a titanium nitride film of, e.g., 15 nm-thick is deposited on the entire surface by, e.g., sputtering method to form a barrier layer 40 of the titanium nitride film. In place of the titanium nitride film, a different conducting film which functions as a barrier metal, e.g., a tantalum nitride film, may be used.

Then, a copper (Cu) film of, e.g., a 130 nm-thick is deposited on the barrier metal layer 40 by, e.g., sputtering method. Then, with the copper film as a seed, a copper film is further deposited by electrolytic plating to form a copper film 42 of a total film thickness of, e.g., 970 nm.

Figure 16B:
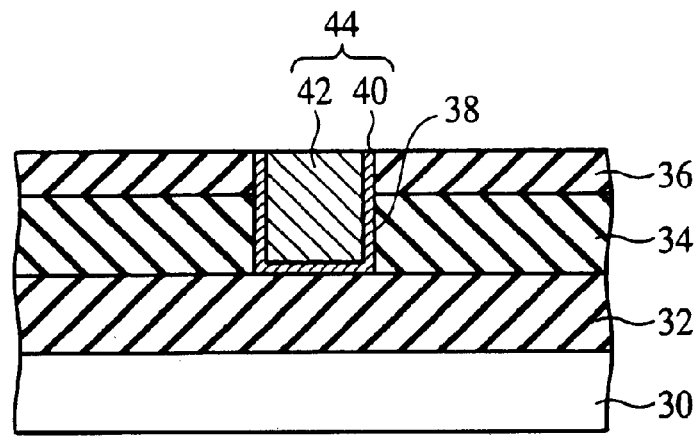

Next, the copper film 42 and the barrier metal layer 40 are planarly removed by, e.g., CMP method until the surface of the silicon oxide film 36 is exposed to form an interconnection layer 44 buried in the interconnection groove 38 and formed of the copper film 42 and the barrier metal layer 40 (FIG. 16B).

Then, a silicon nitride film 46 of, e.g., a 70 nm-thick and a silicon oxide film 48 of, e.g., a 280 nm-thick are formed on the silicon oxide film 36 with the interconnection layer 44 buried in.

Then, SiLK is applied to the silicon oxide film 48 in, e.g., a 150 nm-thick by, e.g., spin coating method to form the organic insulating film 50 of the SiLK. In place of SiLK, FLARE or others may be used. Other organic insulating materials, such as hydrocarbon-content resin, fluorine-content resin, silicon oxycarbide, etc. may be used. Stacked films of arbitrary ones of these organic insulating materials may be used.

Next, a silicon oxide film 52 of, e.g., a 250 nm-thick and a silicon nitride film 54 of, e.g., a 100 nm-thick are formed on the organic insulating film 50 by, e.g., plasma CVD method.

Figure 16C:
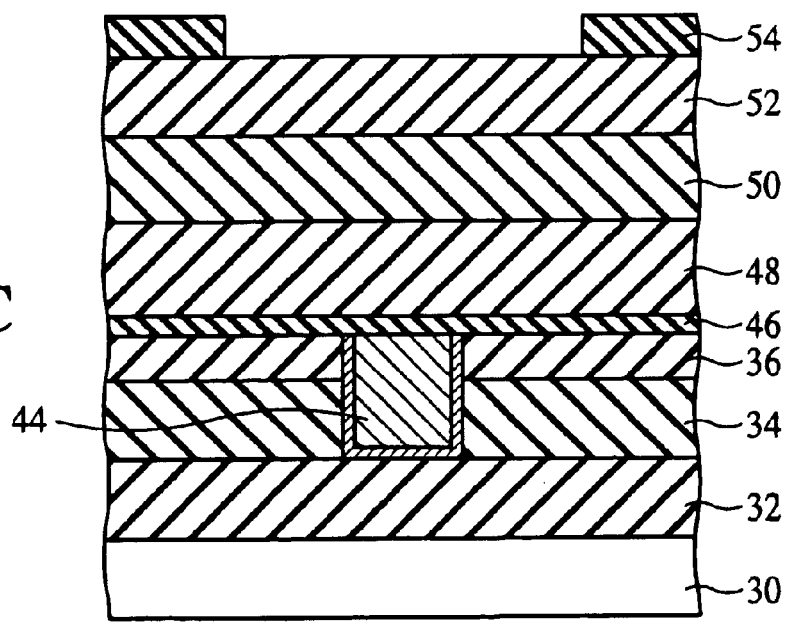

Then, the silicon nitride film 54 is patterned by photolithography and dry etching to remove the silicon nitride film 54 in a region for an interconnection groove to be formed in the organic insulating film 50 and the silicon oxide film 52 (FIG. 16C).

Next, an organic-based antireflection film (BARC: Bottom Anti-Reflective Coat) 56 of, e.g., a 140 nm-thick is formed on the silicon oxide film 52 and the silicon nitride film 54.

Figure 17A:
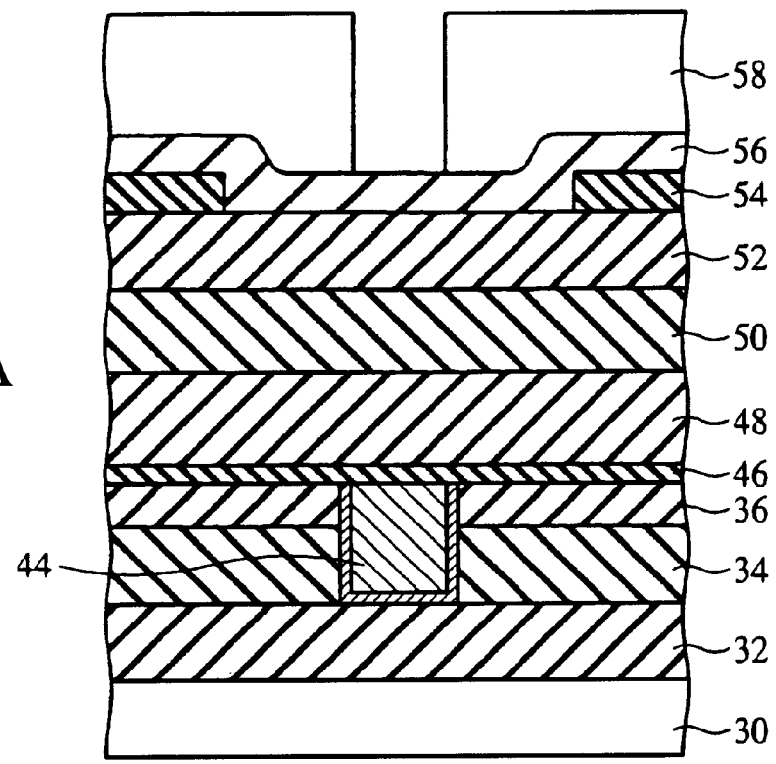

Then, a photoresist film 58 exposing a region for a via hole to be formed in the silicon nitride film 46 and the silicon oxide film 48 is formed on the antireflection film 56 by photolithography (FIG. 17A).

Figure 17B:
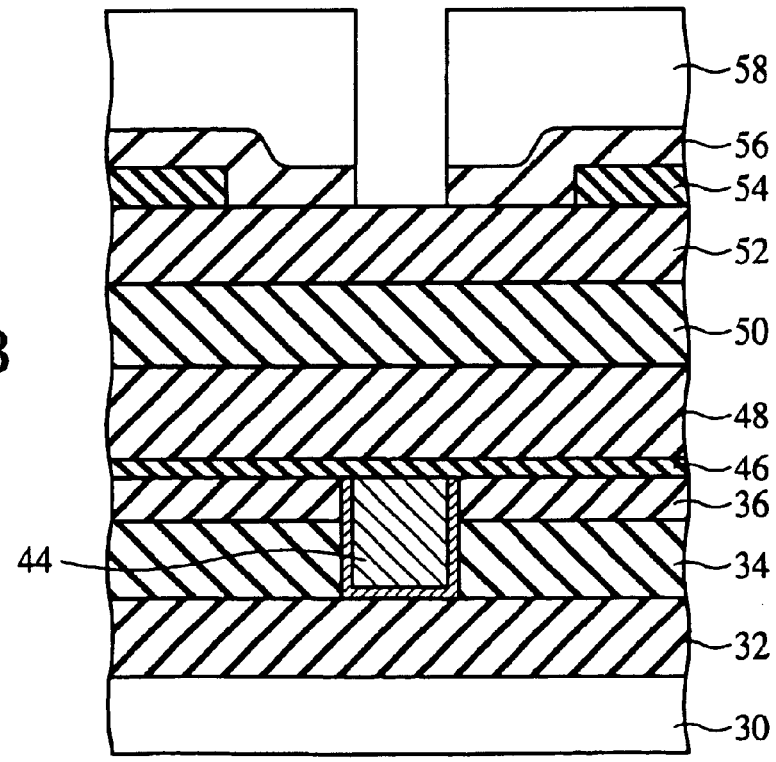

Next, the antireflection film 56 is anisotropically etched by dry etching with the photoresist film 58 as a mask and the silicon oxide film 52 as a stopper to remove the antireflection film 56 in the region for the via hole to be formed in (FIG. 17B).

Figure 18A:
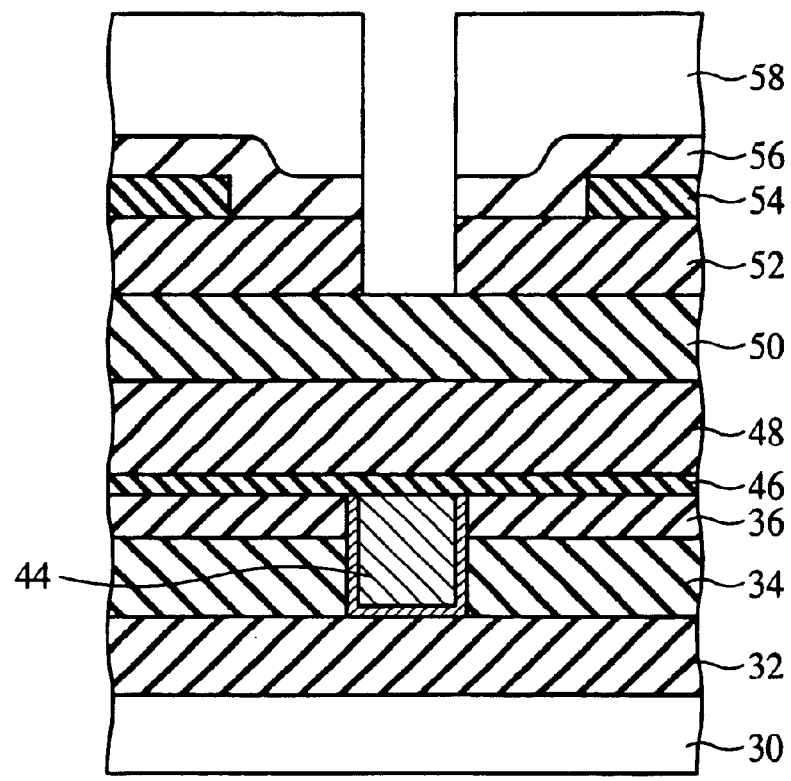

Then, the silicon oxide film 52 is anisotropically etched by dry etching with the photoresist film 58 as a mask and the organic insulating film 50 as a stopper to remove the silicon oxide film 52 in the region for the via hole to be formed in (FIG. 18A).

Next, the organic insulating film 50 is anisotropically etched by dry etching with the photoresist film 58 as a mask and the silicon oxide film 48 as a stopper to remove the organic insulating film 50 in the region for the via hole to be formed in.

The organic insulating film 50 can be etched by the method for etching the organic insulating film according to the first embodiment. The RF power applied to the lower electrode is 200 W, the RF power applied to the upper electrode is 1600 W, the $NH_3$ flow rate is 40 sccm, the pressure in the plasma processing chamber is 50 mTorr, the inter-electrode gap is 30 mm, and the substrate temperature is 30° C., whereby the organic insulating film 50 can be etched while the bowing and the corner loss of the silicon oxide film 52 as the hard mask are prevented.

Figure 18B:
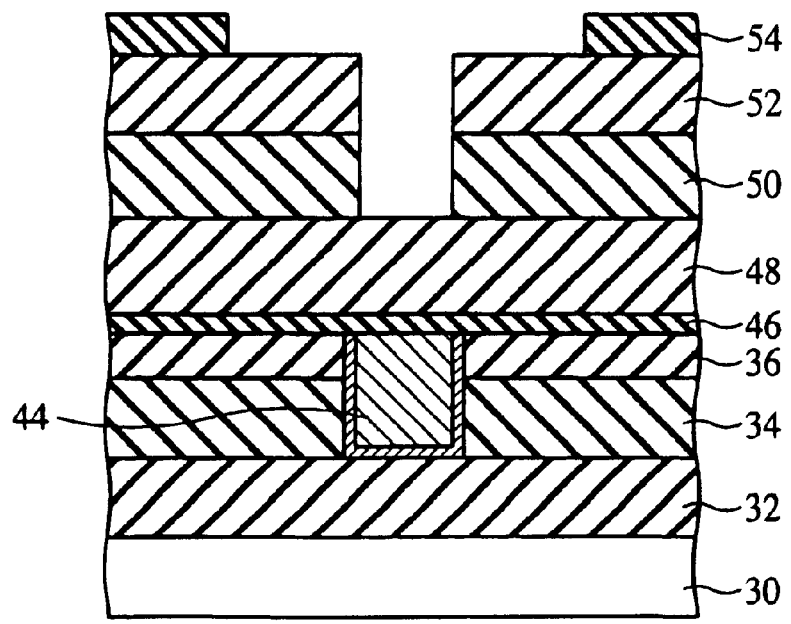

Concurrently with etching the organic insulating film 50, the photoresist film 58 which has been used in etching the silicon oxide film 36 and the antireflection film 56 are removed (FIG. 18B).

Figure 19A:
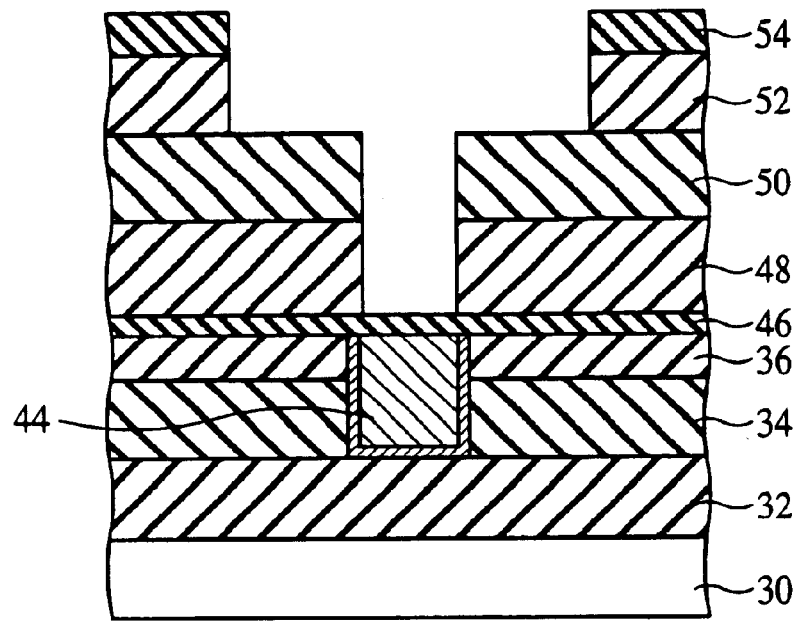

Then, with the silicon nitride film 54 as a mask and the silicon nitride film 46 as a stopper, the silicon oxide films 48, 52 are etched to remove the silicon oxide film 48 in the region for the via hole to be formed in and the silicon oxide film 52 in the region for the interconnection groove to be formed in (FIG. 19A).

Figure 19B:
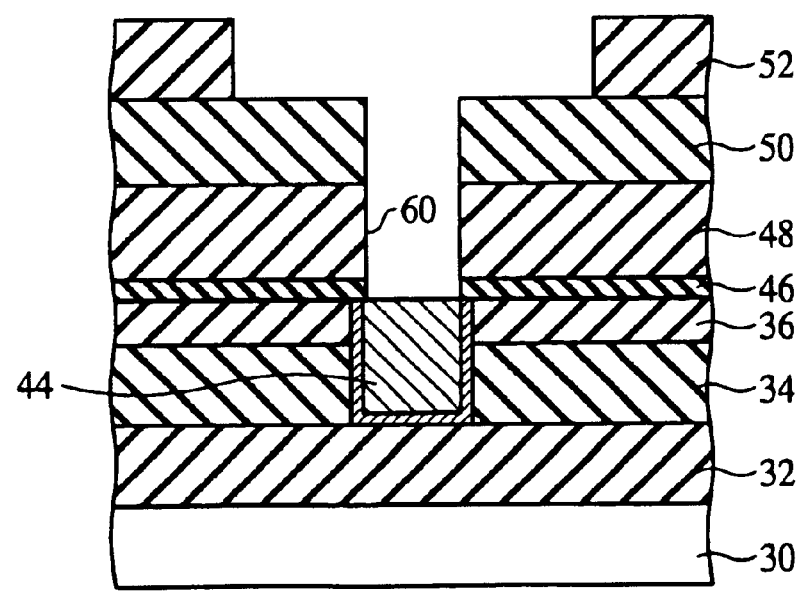

Next, with the organic insulating film 50 as a mask and the silicon oxide film 52 as a stopper, the silicon nitride films 46, 54 are anisotropically etched to form the via hole 60 for exposing the interconnection layer 44 in the silicon nitride film 46 and the silicon oxide film 48 (FIG. 19B).

Figure 20A:
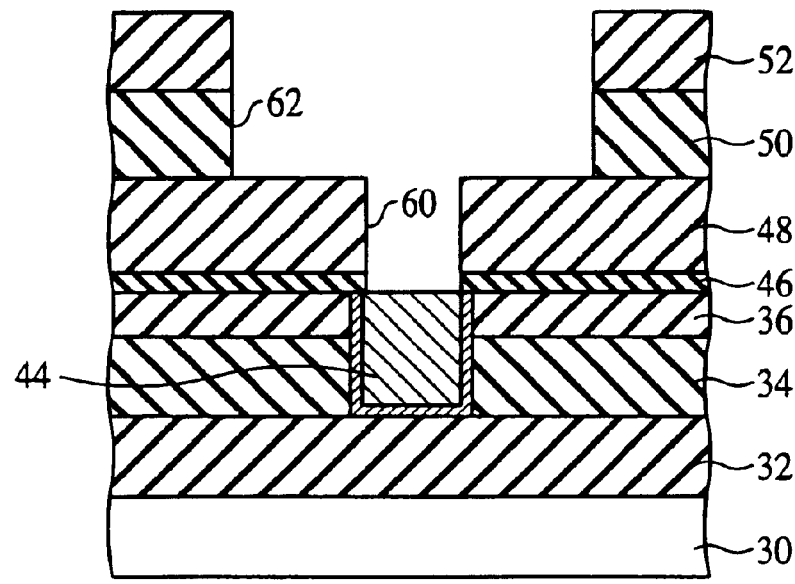
Figure 20B:
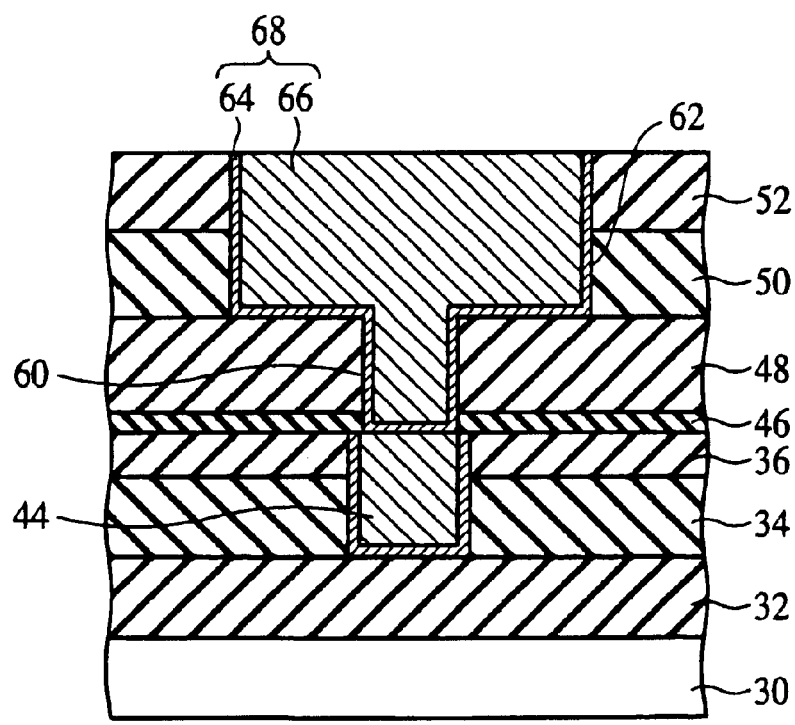

Then, with the silicon oxide film 52 as a mask and the silicon oxide film 48 as a stopper, the organic insulating film 50 is anisotropically etched to form the interconnection groove 62 connected to the via hole 60 in the organic insulating film 50 and the silicon oxide film 52 (FIG. 20A).

The organic insulating film 50 can be etched by the method for etching the organic insulating film according to the first embodiment. The RF power applied to the lower electrode is 200 W, the RF power applied to the upper electrode is 1600 W, the $NH_3$ flow rate is 40 sccm, the pressure in the plasma processing chamber is 50 mTorr, the inter-electrode gap is 30 mm, and the substrate temperature is 30° C., whereby the organic insulating film 50 can be etched while the bowing and the corner loss of the silicon oxide film 52 as the hard mask are prevented.

Then, a titanium nitride film of, e.g., a 15 nm-thick is deposited on the entire surface by, e.g., sputtering method to form a barrier metal layer 64 of the titanium nitride film. In place of the titanium nitride film, a different conducting film which functions as the barrier metal, e.g., a tantalum nitride film, may be used.

Etching the organic insulating film 50 with an $NH_3$ gas with the interconnection layer 44 exposed on the surface has the effect of cleaning the upper surface of the interconnection layer 44. That is, this etching has the effect of removing CF-based polymers adhering to the interconnection layer 44 when the silicon nitride films 46, 54 are etched and reducing the copper surface. This makes the barrier metal layer 64 thin, which can lead to the reduction of the contact resistance.

Then, a copper (Cu) film of, e.g., a 130 nm-thick is deposited on the barrier metal layer 64 by, e.g., sputtering method. Then, with the copper film as a seed, copper film is further deposited by electrolytic plating to form a copper film 66 of a total film thickness of, e.g., 970 nm on the barrier metal layer 64.

Next, the copper film 66 and the barrier metal layer 64 are planarly removed by, e.g., CMP method until the surface of the silicon oxide film 52 is exposed. Thus, an interconnection layer 68 formed of the copper film 66 and the barrier metal layer 64 buried in the via hole 60 and the interconnection groove 62, and electrically connected to the interconnection layer 44 through the via hole 60 is formed.

As described above, in the method for fabricating the semiconductor device, for fabricating the semiconductor device having the organic insulating films, the organic insulating films are etched by the method for etching the organic insulating film according to the first embodiment, whereby the organic insulating films can be processed vertically while the bow amplitude and the corner loss amount of the hard masks are decreased.

The etching with the $NH_3$ gas gives no undesirable influences, such as corroding the interconnection mainly formed of copper, etc., and in etching the organic insulating films, the copper interconnections can be exposed without any trouble.

Oppositely, the etching with the $NH_3$ gas has the effect of cleaning the surfaces of the interconnections, and when another interconnection is formed on the interconnection, the barrier metal layer can be thin. This allows the contact resistance to be lower.

The present invention is not limited to the above-described embodiments and can cover other various modifications.

In the above-described embodiments, the hard masks for the organic insulating films are silicon oxide film but can be other insulating films. For example, silicon nitride film, silicon oxynitride film, etc. may be used. The silicon oxide film may contain no impurities and may contain boron and phosphorus. In the second embodiment, silicon carbide film may be used in place of silicon nitride film. In the specification of the present application, these insulating films are also called an inorganic insulating film in contrast to the organic insulating film.

In the above-described embodiments, the same organic insulating films are etched, but the method for etching the organic insulating film according to the present invention is applicable to stacked film of two or more different organic insulating films. The present invention is applicable to, e.g., the inter-layer insulating film structure of a SiLK film on a FLARE film, the inter-layer insulating film structure of an FLARE film on a SiLK film, and other structures.

In the above-described second embodiment, two interconnection layers mainly formed of copper are formed, but one or more interconnection layers may be further formed on the interconnection layer 68. One or more interconnection layers may be formed below the interconnection layer 44.

What is claimed is:

1. A method for etching an organic insulating film in which a first RF power having a first frequency is applied to a first electrode with an object-to-be-processed having an organic insulating film mounted on, a second RF power having a second frequency different from the first frequency is applied to a second electrode opposed to the first electrode, whereby plasma of gas containing $NH_3$ is generated to etch the organic insulating film, the first RF power and the second RF power being controlled to make a Vpp value of a voltage applied to the first electrode below 500 V.

2. A method for etching an organic insulating film according to claim 1, wherein
a pressure in a plasma processing chamber where the plasma is generated is controlled to be below 100 mTorr.

3. A method for etching an organic insulating film according to claim 1, wherein
a flow rate of an $NH_3$ gas is controlled to be below 50 sccm.

4. A method for etching an organic insulating film according to claim 2, wherein
a flow rate of an $NH_3$ gas is controlled to be below 50 sccm.

5. A method for etching an organic insulating film according to claim 1, wherein
a cross-sectional etching profile of the organic insulating film is controlled by the second RF power.

6. A method for etching an organic insulating film according to claim 1, wherein
the first RF power and the second RF power are controlled to make a sum of a Vdc value and the Vpp value of the voltage to be applied to the first electrode below 500 V.

7. A method for etching an organic insulating film according to claim 1, wherein
a gap between the first electrode and the second electrode is further controlled to make the Vpp value below 500 V.

8. A method for etching an organic insulating film according to claim 6, wherein
a gap between the first electrode and the second electrode is further controlled to make the sum of the Vdc value and the Vpp value below 500 V.

9. A method for etching an organic insulating film according to claim 1, wherein
the second RF power is higher than the first RF power.

10. A method for etching an organic insulating film according to claim 1, wherein
the second frequency is larger than the first frequency.

11. A method for fabricating a semiconductor device comprising the step of:
sequentially forming an organic insulating film and an inorganic insulating film on a substrate;
patterning the inorganic insulating film; and
etching the organic insulating film with the patterned inorganic insulating film as a mask,
in the step of etching the organic insulating film, a method for etching the organic insulating film in which a first RF power having a first frequency is applied to a first electrode with the substrate mounted on and a second RF power having a second frequency different from the first frequency is applied to a second electrode opposed to the first electrode, whereby plasma of gas containing $NH_3$ is generated to etch the organic insulating film being used, and the first RF power and the second RF power being controlled so as to make a Vpp value of a voltage to be applied to the first electrode below 500 V.

12. A method for fabricating a semiconductor device according to claim 11, wherein
in the step of etching the organic insulating film, a pressure in a plasma processing chamber where the plasma is generated is controlled to be below 100 mTorr.

13. A method for fabricating a semiconductor device according to claim 11, wherein
in the step of etching the organic insulating film, a flow rate of an $NH_3$ gas is controlled to be below 50 sccm.

14. A method for fabricating a semiconductor device according to claim 12, wherein in the step of etching the organic insulating film, a flow rate of an $NH_3$ gas is controlled to be below 50 sccm.

15. A method for fabricating a semiconductor device according to claim 11, wherein the substrate has on a surface side a first interconnection layer formed of mainly copper, in the step of etching the organic insulating film, the organic insulating film is etched with the first interconnection layer exposed.

16. A method for fabricating a semiconductor device according to claim 11, further comprising after the step of etching the organic insulating film, the step of:

forming an interconnection layer buried in the inorganic insulating film and the organic insulating film.

17. A method for fabricating a semiconductor device according to claim 15, further comprising after the step of etching the organic insulating film, the step of:

forming a second interconnection layer buried in the inorganic insulating film and the organic insulating film.

18. A method for fabricating a semiconductor device according to claim 11, wherein the organic insulating film has a stacked structure including two or more different organic insulating materials.

* * * * *